(12) United States Patent
Kinoshita et al.

(10) Patent No.: US 7,369,209 B2
(45) Date of Patent: May 6, 2008

(54) BENDABLE DISPLAY APPARATUS AND METHOD OF MANUFACTURING THE SAME

(75) Inventors: Masaki Kinoshita, Saku (JP); Kenji Kawamata, Kumagaya (JP); Satoru Yamanaka, Fukaya (JP); Hiroyuki Kurisu, Ageo (JP); Tatsuya Miyazaki, Fukaya (JP); Yasushi Kawata, Ageo (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/546,985

(22) Filed: Oct. 13, 2006

(65) Prior Publication Data

US 2007/0030439 A1 Feb. 8, 2007

Related U.S. Application Data

(60) Division of application No. 10/807,186, filed on Mar. 24, 2004, now Pat. No. 7,148,944, which is a continuation of application No. PCT/JP03/06071, filed on May 15, 2003.

(30) Foreign Application Priority Data

| May 17, 2002 | (JP) | ............................. 2002-143812 |
| May 17, 2002 | (JP) | ............................. 2002-143813 |
| May 17, 2002 | (JP) | ............................. 2002-143814 |
| May 13, 2003 | (JP) | ............................. 2003-134349 |

(51) Int. Cl.
*G02F 1/1333* (2006.01)

(52) U.S. Cl. .......................................... 349/158; 349/96
(58) Field of Classification Search ................. 349/158
See application file for complete search history.

(56) References Cited

U.S. PATENT DOCUMENTS

| 5,396,351 A * | 3/1995 | Gessel ........................ 349/159 |
| 6,262,787 B1 | 7/2001 | Kamoi et al. |
| 6,335,771 B1 | 1/2002 | Hiraishi |
| 6,356,330 B1 | 3/2002 | Ando et al. |
| 6,473,140 B1 | 10/2002 | Mizobata et al. |
| 6,512,504 B1 * | 1/2003 | Yamauchi et al. ............. 345/87 |
| 6,717,641 B2 * | 4/2004 | Arai ........................... 349/114 |
| 6,731,357 B1 * | 5/2004 | Tachibana et al. ............ 349/96 |
| 6,812,974 B1 | 11/2004 | Hinata et al. |
| 6,876,422 B2 * | 4/2005 | Ishiwa et al. ................ 349/149 |

FOREIGN PATENT DOCUMENTS

| EP | 0 342 925 A2 | 11/1989 |
| JP | 51-83496 | 7/1976 |
| JP | 53-93858 | 8/1978 |
| JP | 58-114085 | 7/1983 |

(Continued)

*Primary Examiner*—David Nelms
*Assistant Examiner*—Richard H Kim
(74) *Attorney, Agent, or Firm*—Oblon, Spivak, McClelland, Maier & Neustadt, P.C.

(57) ABSTRACT

A display apparatus with a plurality of display pixel sections includes glass substrate, which are formed to have a thickness that permits bending of the display apparatus, and polarizer plates, which are disposed on the glass substrates, respectively. The polarizer plates are thicker than the glass substrates.

6 Claims, 14 Drawing Sheets

FOREIGN PATENT DOCUMENTS

| | | |
|---|---|---|
| JP | 60-188929 | 9/1985 |
| JP | 60-247618 | 12/1985 |
| JP | 1-196620 A | 8/1989 |
| JP | 2-264217 | 10/1990 |
| JP | 4-235527 | 8/1992 |
| JP | 5-61011 | 3/1993 |
| JP | 6-67135 | 3/1994 |
| JP | 6-194615 | 7/1994 |
| JP | 6-230356 | 8/1994 |
| JP | 8-50282 | 2/1996 |
| JP | 9-160052 | 6/1997 |
| JP | 2678325 | 8/1997 |
| JP | 10-48663 | 2/1998 |
| JP | 11-38395 | 2/1999 |
| JP | 11-174463 | 7/1999 |
| JP | 3059866 | 4/2000 |
| JP | 2001-202028 | 7/2001 |
| KR | 1998-020094 | 6/1998 |
| KR | 2002-0001638 | 1/2002 |

\* cited by examiner

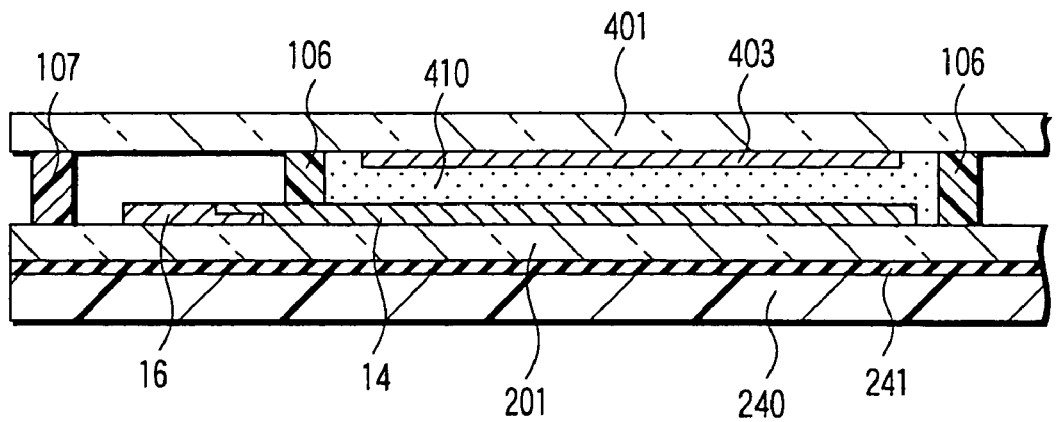
F I G. 7A
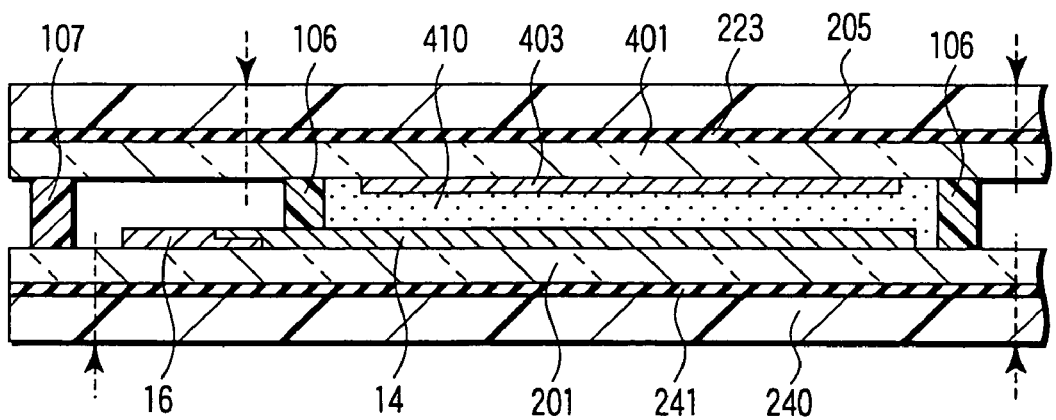
F I G. 7B
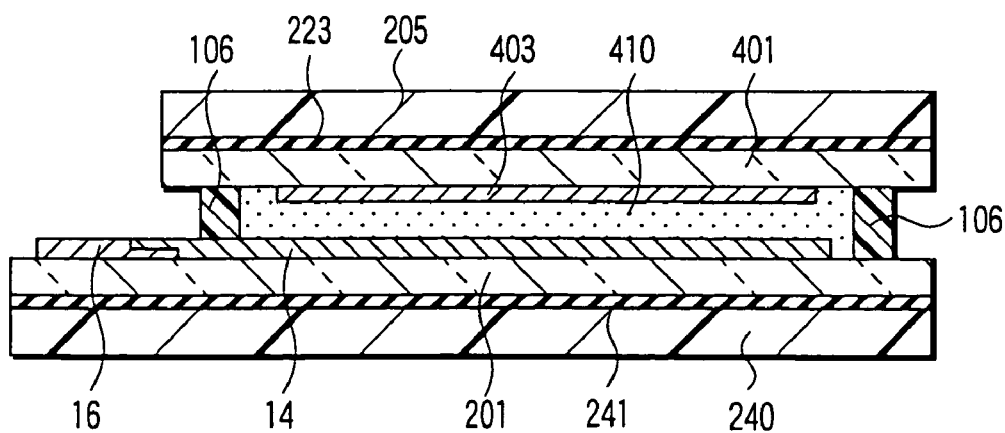
F I G. 7C

BENDABLE DISPLAY APPARATUS AND METHOD OF MANUFACTURING THE SAME

CROSS REFERENCE TO RELATED APPLICATIONS

This application is a divisional of U.S. application Ser. No. 10/807,186 filed on Mar. 24, 2004 now U.S. Pat. No. 7,148,944, which is a continuation of PCT/JP03/06071 filed May 15, 2003, all of which claim priority to Japanese Patent Application No. 2003-134349 filed May 13, 2003, Japanese Patent Application No. 2002-143814 filed May 17, 2002, Japanese Patent Application No. 2002-143813 filed May 17, 2002, Japanese Patent Application No. 2002-143812 filed May 17, 2002. Each of these cross-referenced applications are incorporated by reference herein.

BACKGROUND OF THE INVENTION

1. Field of the Invention

The present invention relates to a display apparatus and a manufacturing method thereof, and, more particularly, to a structure of a display apparatus that can achieve reduction in thickness.

2. Description of the Related Art

Flat panel display apparatuses represented by a liquid crystal display apparatus are applied to various fields, taking advantage of such features as light weight, thin shape and low power consumption. In particular, a liquid crystal display apparatus is widely applied to mobile information apparatuses represented by personal computers.

In recent years, there is a demand for further reduction in thickness of the liquid crystal display apparatus. To meet the demand, there is an idea that a thin glass substrate is used. However, fabrication with use of a glass substrate that has a thickness of less than 0.5 mm may lead to a decrease in manufacturing yield, since conveyance, etc. thereof is difficult because of a problem of bending due to its own weight. A display apparatus formed with such a substrate may easily suffer crack or chip at its end part due to weak shock, and moreover the entirety of the apparatus may be broken. There is an alternative idea that a resin film, for instance, is used in place of the glass substrate. This, however, is not practical since constraints such as film formation temperatures are imposed.

On the other hand, a manufacturing method has been proposed, wherein the outer surface of one of substrates that are components of the liquid crystal apparatus is thinned by etching (see, e.g. Japanese Patent No. 2678325). According to this manufacturing method, one of the substrates is thinned to about 0.1 to 0.2 mm by etching, while the other substrate is about 0.3 to 1.1 mm thick and has a high strength as the substrate. Moreover, a sufficient strength of the liquid crystal display apparatus is achieved.

The liquid crystal display apparatus fabricated by this manufacturing method, however, still fails to realize the reduction in thickness and weight that is required in the market. With this manufacturing method, it is not possible to manufacture a liquid crystal display apparatus that is flexible while maintaining display performance.

BRIEF SUMMARY OF THE INVENTION

The present invention has been made in order to solve the above problems, and its object is to provide a display apparatus and a manufacturing method thereof, which can achieve further reduction in thickness while maintaining display performance. In addition, the object of the invention is to provide a display apparatus and a manufacturing method thereof, which can achieve further reduction in thickness while having high durability.

In order to solve the problem and achieve the object, a first aspect of the invention provides a display apparatus having an optical material between a pair of substrates, and having a plurality of display pixel sections, wherein each of the substrates has a glass substrate and a film that is attached to an outer surface of the glass substrate and has a thickness greater than a thickness of the glass substrate, at least one of the films is formed of a polarizer plate, and each of the glass substrate is formed to have a thickness that permits bending of the display apparatus.

A second aspect of the invention provides a display apparatus having a plurality of display pixel sections on one of major surfaces of a substrate, wherein the substrate has a glass substrate and a polarizer plate that is disposed to extend to an end part of the glass substrate on the other major surface of the substrate, and has a thickness greater than a thickness of the glass substrate, and the glass substrate is formed to have a thickness that permits bending of the display apparatus.

A third aspect of the invention provides a method of manufacturing a display apparatus having an optical material between a pair of glass substrates comprising:

(a) a step of attaching the pair of glass substrates together with a predetermined distance;

(b) polishing an outer surface of each of the glass substrates to a thickness of 0.15 mm or less;

(c) attaching a film to the outer surface of at least one of the glass substrates, the film having a thickness greater than a thickness of the glass substrate; and (d) cutting the film and the pair of glass substrates into a predetermined size.

BRIEF DESCRIPTION OF THE SEVERAL VIEWS OF THE DRAWING

FIG. 7A to FIG. 7C are views illustrating the manufacturing method of the liquid crystal display panel according to the embodiment of the invention;

FIG. 16 is a view schematically showing the structure of an organic EL display apparatus according to an embodiment of the present invention;

DETAILED DESCRIPTION OF THE INVENTION

Display apparatuses according to embodiments of the present invention will now be described with reference to the accompanying drawings.

First Embodiment

Figure 1:
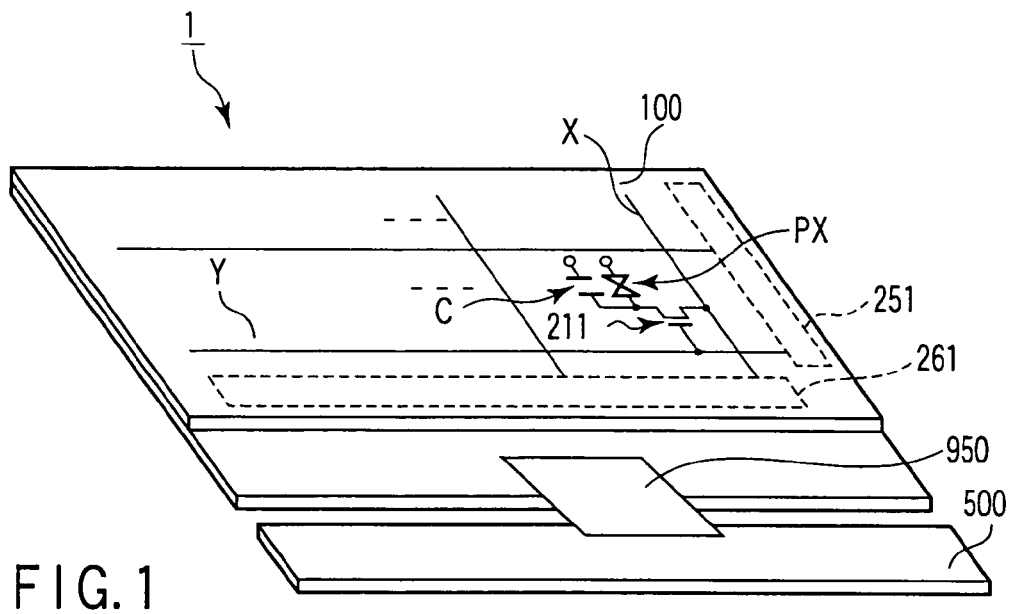
FIG. 1 schematically shows the structure of a liquid crystal display apparatus according to an embodiment of the present invention.
Figure 2:
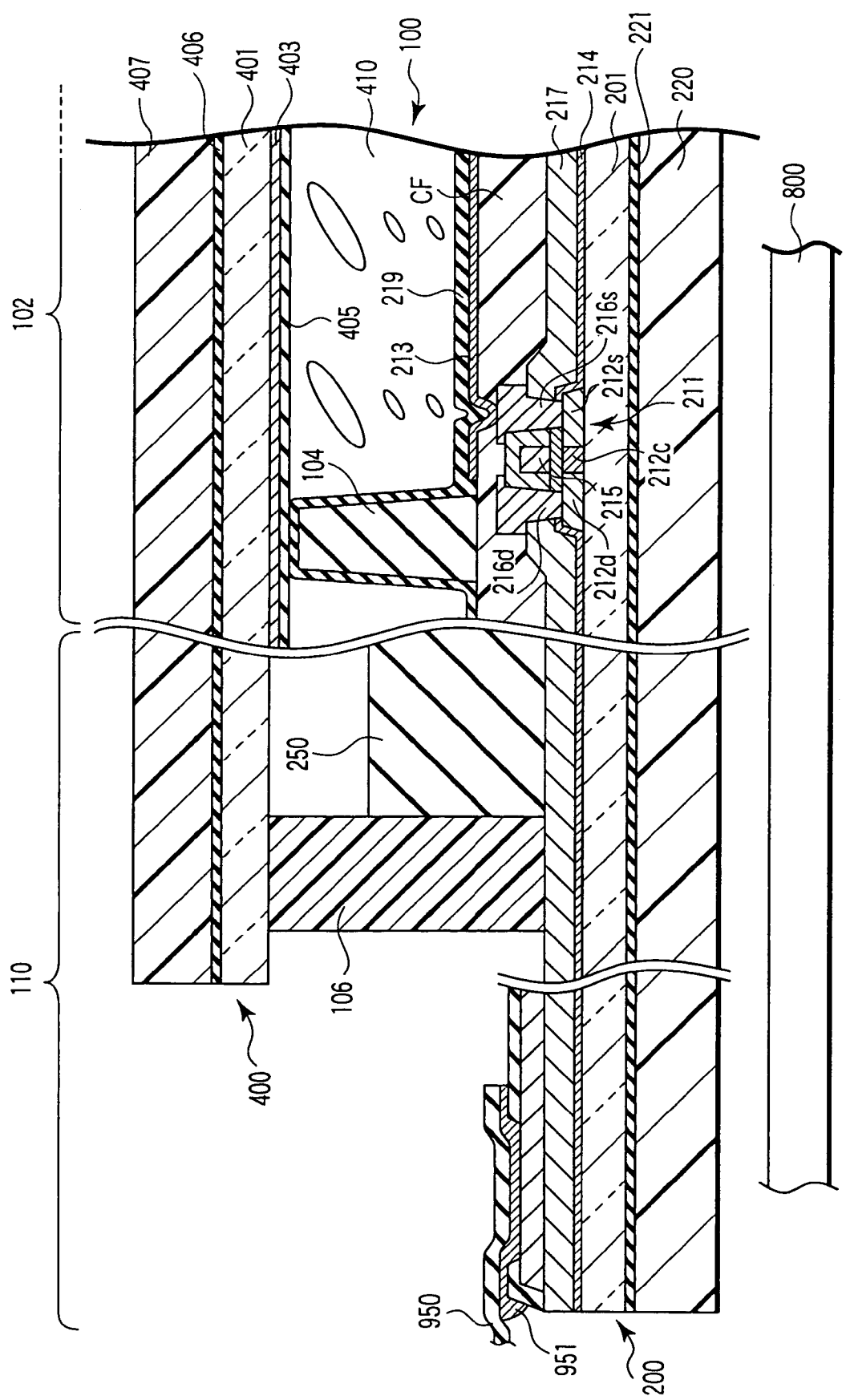
FIG. 2 is a cross-sectional view schematically showing an example of the structure of a light-transmission type liquid crystal panel that is applicable to a liquid crystal display apparatus according to a first embodiment of the invention.

As is shown in FIG. 1 and FIG. 2, a display apparatus according to a first embodiment, that is, a liquid crystal display apparatus 1, comprises a light-transmission type liquid crystal panel 100, a drive circuit board 500 that supplies drive signals to the liquid crystal panel 100, and a backlight unit 800 that illuminates the liquid crystal panel 100 from its back side. The liquid crystal panel 100 and drive circuit board 500 are electrically connected by a flexible wiring board 950. The flexible wiring board 950 is electrically connected to the liquid crystal panel 100 and drive circuit board 500 by, e.g. an anisotropic conductive film (ACF) 951.

The liquid crystal panel 100 has an effective display region 102 with a diagonal size of 12.1 inches. The effective display region 102 includes a plurality of display pixel sections PX arranged in a matrix. The liquid crystal panel 100 includes an array substrate 200, a counter substrate 400, and a liquid crystal layer 410 that is held between the array substrate 200 and counter substrate 400, with alignment films 219 and 405 interposed, respectively. This liquid crystal panel 100 suitably adopts a display mode in which display is not greatly affected by a variation in cell gap, for example, a twisted nematic (TN) display mode or an IPS (In Plane Switching) display mode. This embodiment adopts a TN display mode in which liquid crystal molecules provided between substrates are aligned with 90° twist.

In order to achieve further reduction in thickness, the array substrate 200 includes a light-transmissive insulation substrate 201 that is formed of glass with a thickness of 0.15 mm or less, preferably 0.1 mm or less (with a thickness of 0.1 mm in the first embodiment). The insulation substrate 201 includes, on one of its major surfaces (i.e. front surface), a plurality of signal lines X and a plurality of scan lines Y arranged in a matrix, switch elements 211 disposed near intersections of the signal lines X and scan lines Y, and pixel electrodes 213 connected to the switch elements 211.

The switch element 211 comprises a thin film transistor (TFT). The switch element 211 includes a polysilicon (p-Si) film as an active layer. The p-Si film includes a channel region 212c, and a source region 212s and a drain region 212d that sandwich the channel region 212c.

A gate electrode 215 of the switch element 211 is formed of, e.g. an MoW (molybdenum-tungsten) alloy film that is integral with the scan line Y, and it is connected to the scan line Y. The gate electrode 215 is located just above the channel region 212c of the p-Si film and is disposed on a gate insulation film 214 that is formed of, e.g. a TEOS (tetra ethoxy silane) film.

A source electrode 216s of the switch element 211 is formed of, e.g. an AlNd (aluminum-neogymium) alloy film. The source electrode 216s is connected to the source region 212s of the p-Si film and to the pixel electrode 213. A drain electrode 216d of the switch element 211 is formed of, e.g. an AlNd (aluminum-neogymium) alloy film, which is integral with the signal line X. The drain electrode 216d is connected to the drain region 212d of the p-Si film and to the signal line X.

The switch element 211 with the above structure is covered with an interlayer insulation film 217 that is formed of an oxide film such as $SiO_2$, or a nitride film such as SiNx. The interlayer insulation film 217 is covered with a color filter layer CF that is formed of a color resist layer, which is processed to have a predetermined pattern by a photolithography process. In the first embodiment, the interlayer insulation film 217 is formed of, e.g. silicon nitride. The color filter layer CF is formed of a negative type color resist layer, which is colored with, e.g. red, green or blue. Color filter layers with the respective colors are disposed on the associated display pixel sections PX of the corresponding colors.

The pixel electrode 213 is formed of a light-transmissive conductive material such as ITO (indium tin oxide) or IZO (indium zinc oxide). The pixel electrode 213 is disposed on the color filter layer CF. The alignment film 219 is disposed over the entire effective display region 102 so as to cover all pixel electrodes 213.

The counter substrate 400 includes a light-transmissive insulation substrate 401 that is formed of glass with a thickness of 0.15 mm or less, preferably 0.1 mm or less (with a thickness of 0.1 mm in the first embodiment). The insulation substrate 401 includes, on one of its major surfaces (i.e. front surface), a counter electrode 403 that is disposed to face the pixel electrode 213. The counter electrode 403 is formed of a light-transmissive conductive material such as ITO. The alignment film 405 is disposed over the entire effective display region 102 so as to cover all counter electrodes 403.

A columnar spacer 104 for providing a predetermined gap between the array substrate 200 and counter substrate 400 is disposed within the effective display region 102. The columnar spacer 104 is fixed to one of the substrates. For example, the columnar spacer 104 is formed of a black resin disposed on the array substrate 200, and is fixed to the array substrate 200. A light-shield layer 250 is formed in a frame-like shape on the outside of the effective display region 102. The light-shield layer 250 is formed of a resin having light-shielding properties. For example, the light-shield layer 250 is formed of the same black resin as the columnar spacer 104. The array substrate 200 and counter substrate 400 are attached to each other by a seal material 106, with a predetermined gap of, e.g. 4 μm, being maintained by the columnar spacer 104.

A drive circuit section 110 that is formed integral with the array substrate 200 is disposed on a peripheral region of the effective display region 102. Specifically, the drive circuit section 110 includes a scan line drive circuit 251 and a signal line drive circuit 261. The scan line drive circuit 251 is connected to one end of each scan line Y and supplies a scan pulse to an associated scan line Y. The signal line drive circuit 261 is connected to one end of each signal line X and supplies a video signal to an associated signal line X. The scan line drive circuit 251 and signal line drive circuit 261, like the switch element 211 within the effective display region 102, are formed of thin-film transistors including polysilicon films.

The liquid crystal panel 100 includes a pair of polarizer plates 220 and 407 that are arranged on an outer surface of the array substrate 200 and an outer surface of the counter substrate 400, respectively. The directions of polarization of the polarizer plates 220 and 407 are set in accordance with characteristics of the liquid crystal layer 410. Specifically, the polarizer plate 220 is attached to the other major surface (back surface) of the insulation substrate 201 of array substrate 200 by an adhesive 221. The polarizer plate 407 is attached to the other major surface (back surface) of the insulation substrate 401 of counter substrate 400 by an adhesive 406.

The polarizer plates 220 and 407 are formed of a resin with flexibility. Specifically, the polarizer plates 220 and 407 are formed such that a resin layer in which iodine is aligned is interposed between TAC films. Each of the polarizer plates 220 and 407 is sufficiently extended to the end part of the insulation substrate. In other words, the polarizer plate 220 has a dimension that is equal to or greater than the dimension of the array substrate 200, and the polarizer plate 407 has a dimension that is equal to or greater than the dimension of the counter substrate 400. In the first embodiment, the end of the insulation substrate is made to correspond to the end of the polarizer plate. Alternatively, the end of the polarizer plate may extend beyond the end of the insulation substrate so as to cover the corner of the insulation substrate. Each of the polarizer plates 220 and 407 is thicker than each of the insulation substrates 201 and 401, and it has a thickness of, e.g. 0.3 mm.

In order to reduce the thickness of the liquid crystal panel 100, each of the insulation substrates 201 and 401 is extremely thinned to, e.g. about 0.1 mm. Even in this case, the provision of the polarizer plates 220 and 407 can reinforce the insulation substrates 201 and 401. Thereby, even if a bending stress is applied to the liquid crystal panel 100, crack of the insulation substrate 201, 401 can be prevented, and a liquid crystal display apparatus with flexibility, which is not easily broken, can be provided. In particular, since the polarizer plates are fully extended to the ends of the insulation substrates, the occurrence of crack and chip in the insulation substrates can remarkably be reduced.

It was found that even where the liquid crystal panel 100 with the above-described structure was bent with a radius of curvature of 200 mm or less, and further with a radius of curvature of 150 mm, no damage occurred and the display quality was maintained.

A method of manufacturing the light-transmission type liquid crystal panel in the liquid crystal display apparatus with the above-described structure will now be described.

Figure 4:
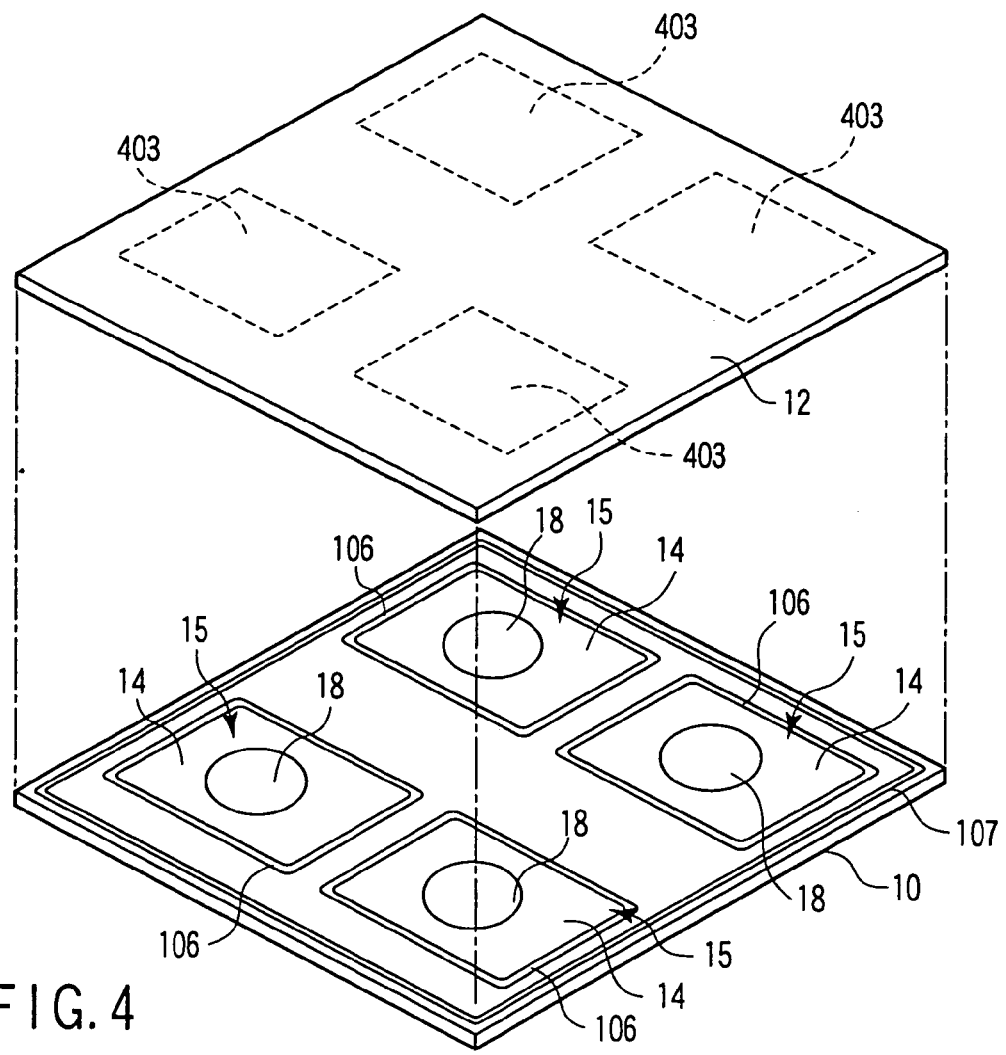
FIG. 4 is a view for explaining a manufacturing method of a liquid crystal display panel according to an embodiment of the invention.
Figure 5:
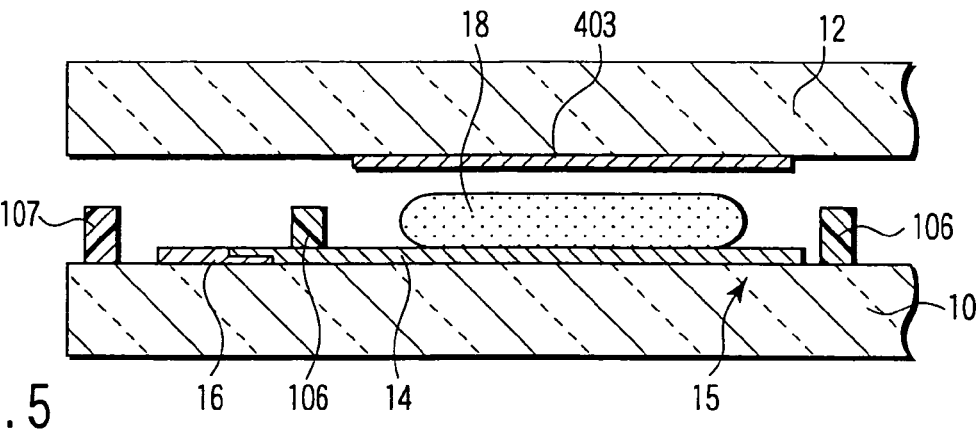
FIG. 5 is a view for explaining a manufacturing method of a liquid crystal display panel according to an embodiment of the invention.

As is shown in FIG. 4 and FIG. 5, a first glass substrate 10 and a second glass substrate 12, each having a thickness of about 0.7 mm and formed of non-alkali glass, are prepared. In the manufacturing method to be described below, bending of the substrates in a conveyance step, for instance, is taken into account, and the glass substrates each with a thickness of 0.7 mm are prepared. Alternatively, relatively thin glass substrates each with a thickness of, e.g. 0.5 mm may be employed to shorten the time for polishing the substrates in a subsequent step. The first glass substrate 10 and second glass substrate 12 are formed in a rectangular shape with such a size that four liquid crystal panels, for instance, can be assigned.

A display device circuit section 14 including a switch element formed by using a polysilicon film as an active layer, a pixel electrode, a color filter, etc. is formed in each of four display regions 15 provided on the first glass substrate 10. For example, the polysilicon (p-Si) film is formed in the following manner. To begin with, an amorphous (a-Si) film is formed by CVD, for instance. An excimer laser beam, for example, is applied to the a-Si film, thus causing crystal growth. Then, impurities, as desired, are doped. The doped impurities are activated at about 600° C. Thus, a polysilicon film is formed. Since the glass substrate is used, a high-temperature process of 450° C. or more can be employed. A connection electrode section 16 for wiring inside and outside the liquid crystal panel is formed on the peripheral region of each display region 15. Further, the drive circuit section is formed on the peripheral region.

Subsequently, a seal material 106 is coated in a frame-like shape around each display region 15. Further, a dummy seal 107 is coated along an entire peripheral portion on the first glass substrate 10. The seal material 106 and dummy seal 107 are formed of an adhesive such as a thermosetting adhesive or a light (UV) curing adhesive. In this example, the seal material 106 and dummy seal 107 are applied by a dispenser using, e.g. an epoxy adhesive. The connection electrode section 16 extends to the outside of the seal material 106.

On the other hand, the counter electrode 403 of ITO, etc. are formed at four areas on the second glass substrate 12, which correspond to the display regions.

A predetermined amount of liquid crystal material 18 is dropped on each region surrounded by each seal material 106 on the first glass substrate 10. Then, the first glass substrate 10 and second glass substrate 12 are positioned such that each display region 15 on the first glass substrate 10 faces the associated counter electrode 403 on the second glass substrate 12.

Figure 6A:
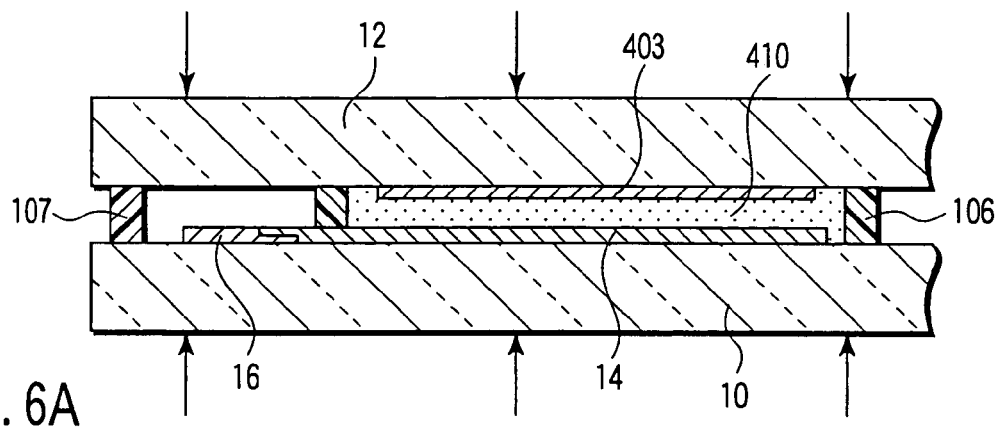
FIG. 6A to FIG. 6C are views illustrating the manufacturing method of the liquid crystal display panel according to the embodiment of the invention.

Thereafter, as shown in FIG. 6A, the first glass substrate 10 and second glass substrate 12 are pressed under a predetermined pressure in directions toward each other.

Thus, the first glass substrate 10 and second glass substrate 12 are attached by the seal material 106 and dummy seal 107. Then, the seal material 106 and dummy seal 107 are cured and the first glass substrate 10 and second glass substrate 12 are attached to each other.

Figure 6B:
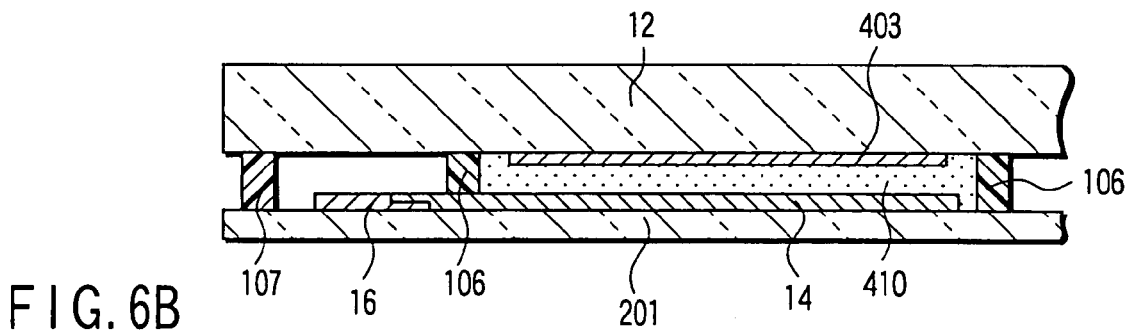

Then, the outer surfaces of the first glass substrate 10 and second glass substrate 12 are polished and thinned. In this embodiment, as shown in FIG. 6B, the first glass substrate 10, on which the display device circuit section 14 is provided, is first polished. The polishing was carried out by chemical etching using a hydrofluoric-acid-based etchant. While the first glass substrate 10 is being polished, the second glass substrate 12 is protected by a sheet having resistance to chemicals. The polishing may be carried out by mechanical polishing or chemical mechanical polishing (CMP).

The first glass substrate 10 is polished into a glass substrate 201 with a thickness of about 0.1 mm. In consideration of conditions such as flexibility, polishing precision, mechanical strength and internal stress in formation of display device circuits, it is desirable that the thickness of the glass substrate 201 be set at about 0.15 mm or less, and preferably 0.1 mm or less. If the glass substrate has a thickness greater than 0.15 mm, flexibility of the glass substrate against bending would be lost. On the other hand, if the glass substrate is extremely thinned, entrance of moisture cannot be prevented and the reliability of the liquid crystal panel will deteriorate. Therefore, it is desirable that the thickness of the glass substrate 201 be about 0.01 mm or more.

Figure 6C:
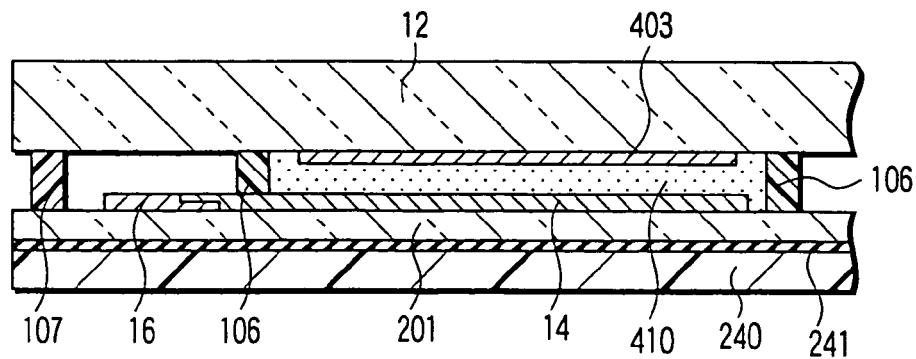

Subsequently, as shown in FIG. 6C, a reinforcement plate 240 that is about 0.1 mm thick is attached to the outer surface of the polished glass substrate 201 via an adhesive layer 241.

In the following step illustrated in FIG. 7A, the second glass substrate 12 is polished and thinned by the same method as described above into a glass substrate 401 with a thickness of about 0.1 mm. Then, as shown in FIG. 7B, a reinforcement plate 205 that is about 0.1 mm thick is attached to the outer surface of the glass substrate 401 via an adhesive layer 223.

The reinforcement plates 205 and 240 may be formed of, e.g. polyether sulfone (PES), polyethylene naphthalate (PEN), polycarbonate (PC), acrylic resin, reinforced plastic, or polyimide. In this embodiment, PES is used for the reinforcement plate 205.

As has been described above, the first glass substrate 10 and second glass substrate 12 are thinned and reinforced by the reinforcement plates 240 and 205. Then, as shown in FIG. 7B and FIG. 7C, the glass substrates 201 and 401 and reinforcement plates 240 and 205 are cut along at predetermined positions into four sections each forming a liquid crystal panel. The cutting is effected by means of, e.g. a laser, and the glass substrates and reinforcement plates are cut at the same time. A $CO_2$ laser or a second- or fourth-order harmonic UV-YAG laser, for instance, may be used as the laser, thereby providing smooth cut faces and preventing crack, etc. of the glass substrates. The cutting may be effected not by the laser, but by a mechanical cutting method.

Figure 8A:
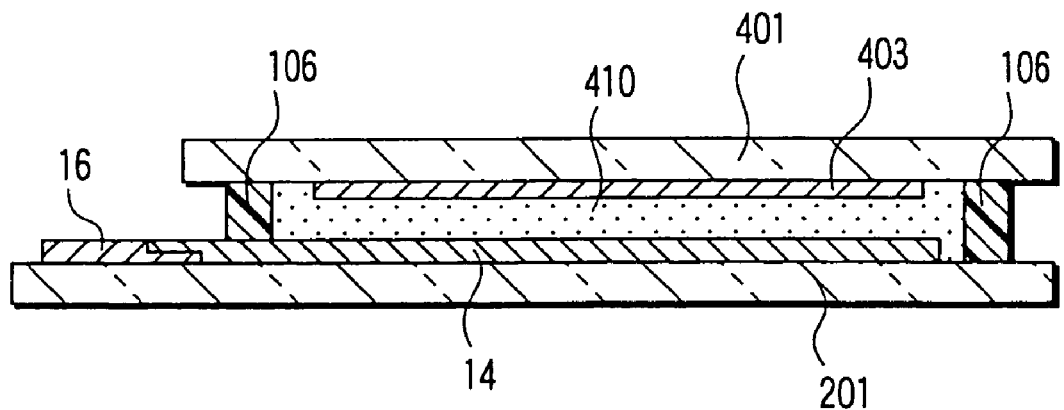
FIG. 8A and FIG. 8B are views illustrating the manufacturing method of the liquid crystal display panel according to the embodiment of the invention.

Subsequently, as shown in FIG. 8A, the reinforcement plate 240 and adhesive layer 241 that are attached to the glass substrate 201 of each cut-out liquid crystal panel are removed by etching or the like. In addition, the reinforcement plate 205 and adhesive layer 223 that are attached to the glass substrate 401 are removed by etching or the like.

Figure 8B:
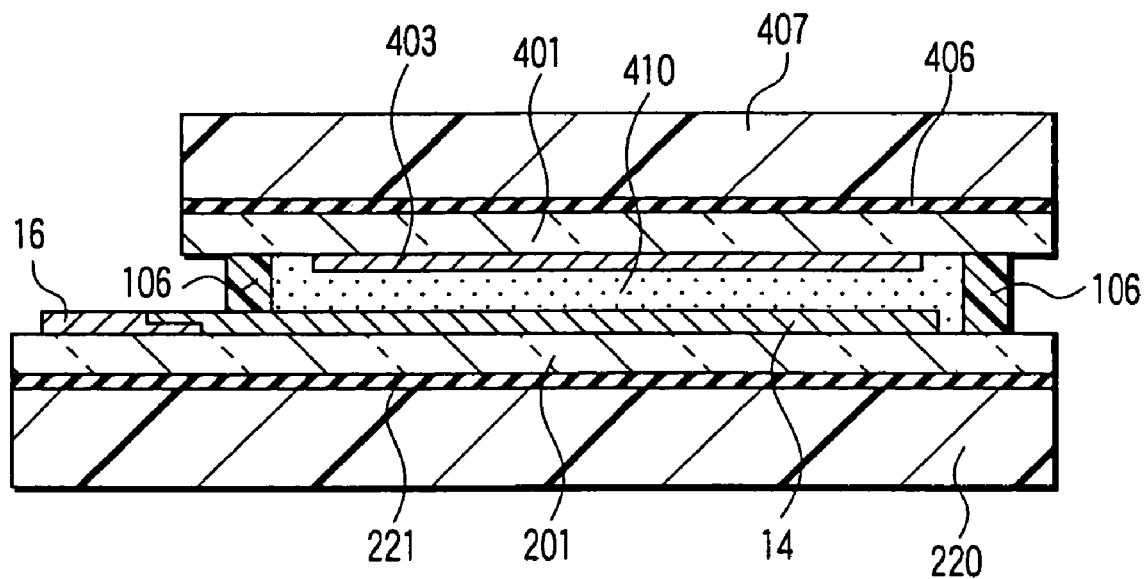

Then, as shown in FIG. 8B, a polarizer plate 220 with a thickness of about 0.3 mm is attached to the outer surface of the glass substrate 201 via an adhesive 221. In addition, a polarizer plate 407 with a thickness of about 0.3 mm is attached to the outer surface of the glass substrate 401 via an adhesive 406.

Through the above-described steps, the light-transmission type liquid crystal panel is completed.

In the above-described method of manufacturing the liquid crystal panel, the liquid crystal material is dropped onto one of the substrates that are to be attached together, and thus the liquid crystal layer 410 is formed. Thereby, the manufacturing time can be decreased. Alternatively, after an empty liquid crystal cell is formed, and a liquid material may vacuum-injected in the liquid crystal cell.

Specifically, necessary structural components are formed on the first glass substrate 10 and second glass substrate 20 by the same steps as described above. Then, the seal material 106 and dummy seal 107 are coated and the first glass substrate 10 and second glass substrate 12 are attached together. When the seal material 106 is coated, an inlet for injecting a liquid crystal material in a later step is formed.

Then, the outer surfaces of the first glass substrate 10 and second glass substrate 12 are polished and thinned, and the reinforcement plates 240 and 205 are attached to the outer surfaces of the glass substrates 201 and 401 via adhesive layers 241 and 223. The glass substrates 201 and 401 and reinforcement plates 240 and 205 are cut along at predetermined positions into four sections each forming a liquid crystal panel.

The reinforcement plate 240 and adhesive layer 241 that are attached to the glass substrate 201 of each cut-out liquid crystal panel are removed by etching or the like. In addition, the reinforcement plate 205 and adhesive layer 223 that are attached to the glass substrate 401 are removed by etching or the like.

Then, the polarizer plate 220 is attached to the outer surface of the glass substrate 201 via the adhesive 221. In addition, the polarizer plate 407 is attached to the outer surface of the glass substrate 401 via the adhesive 406.

Following the above, a liquid crystal material is vacuum-injected in each liquid crystal panel through the inlet. The inlet is then sealed by an ultraviolet-curing resin, etc.

The light-transmission type liquid crystal panel may be manufactured by the above process steps.

The above-described manufacturing method relates to a so-called multi-panel formation method wherein a plurality of liquid crystal panels are cut out from a large-sized substrate. Alternatively, a single liquid crystal panel may be individually manufactured.

In the above-described manufacturing method, the reinforcement plates are attached to the outer surfaces of the polished substrates during the manufacturing process. However, the provision of the reinforcement plates is not always necessary. If such a stress as to damage the substrates is not applied during the manufacturing process, there is no need to attach the reinforcement plates. This also eliminates the need to remove the reinforcement plates, and the manufacturing process is made simpler.

In the step of attaching the reinforcement plates, the polarizer plates may be attached in place of the reinforcement plates. This eliminates the later step of attaching the polarizer plates.

In the liquid crystal display apparatus 1 with the above-described light-transmission type liquid crystal panel 100, light emitted from the backlight unit 800 is made incident on the array substrate 200 of the liquid crystal panel 100 via the polarizer plate 220. The light incident on the liquid crystal panel 100 is modulated by the liquid crystal layer 410 that is controlled by an electric field produced between the pixel electrode 213 and counter electrode 403. Thus, the modulated light passes selectively through the polarizer plate 407 of the counter substrate 400 in units of a display pixel section PX. Thereby, a display image is formed.

According to the liquid crystal display apparatus of the first embodiment, each of the insulation substrates that are structural parts of the array substrate and counter substrate can be extremely thinned. Thus, the reduction in thickness of the liquid crystal panel is achieved. Even in the case where each insulation substrate is extremely thinned, the provision of the polarizer plates that are thicker than the insulation substrates can reinforce the insulation substrates. Thereby, it is possible to provide a liquid crystal display apparatus having such a flexibility as to prevent damage due to bending.

Moreover, in this embodiment, parts of the drive circuit are integrally formed on the array substrate. Thus, the number of locations for connection to the external circuit can be reduced. In the case where the drive circuit is not disposed, the number of locations for connection, which corresponds to the number of signal lines, e.g. 1024×3, are necessary, whereas only 48 locations for connection are required in this embodiment. In addition, in the prior art, the locations for connection are set at least along two sides that are perpendicular to each other. In this embodiment, the 48 locations for connection are arranged along only a part of one side of the liquid crystal panel.

Hence, the area for connection of the flexible wiring board that connects the liquid crystal panel and drive circuit substrate can be reduced. Furthermore, even when the liquid crystal display apparatus is bent, peeling of the flexible wiring board or cutting of lines can be prevented.

The gap between the array substrate and counter substrate is provided by the columnar spacer that is integral with the array substrate. Thus, even when the liquid crystal display apparatus is bent, displacement of the spacer is prevented and accordingly occurrence of defective display due to displacement of the spacer can be prevented. The columnar spacer can be disposed with a desired density according to a design value. Therefore, the gap does not greatly vary due to bending, and a uniform display quality can be obtained.

In the first embodiment, the thickness of the polarizer plate is greater than the thickness of the glass substrate of the array substrate or counter substrate. Hence, when the liquid crystal panel is bent, the polarizer plate presses the glass substrate. This prevents the substrate from bending in a direction opposite to the direction of bending of the liquid crystal panel and increasing the cell gap. Thus, the quality of display is not degraded.

Therefore, it is possible to provide a display apparatus with high reliability and applicability to various uses, which, for example, can be used in a bent state.

Second Embodiment

Figure 3:
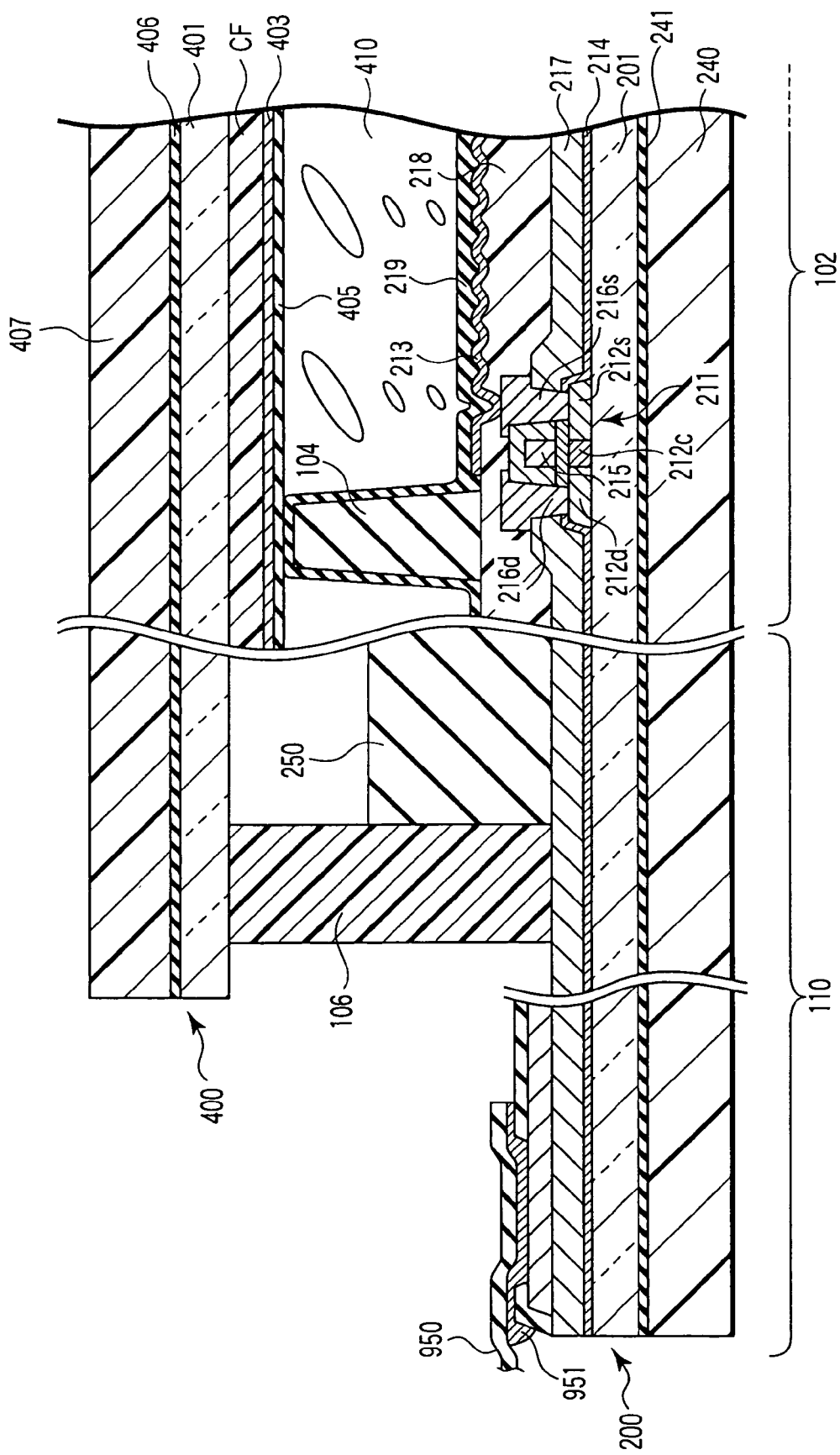
FIG. 3 is a cross-sectional view schematically showing an example of the structure of a light-reflection type liquid crystal panel that is applicable to a liquid crystal display apparatus according to a second embodiment of the invention.

As is shown in FIG. 1 and FIG. 3, a display apparatus according to a second embodiment, that is, a liquid crystal display apparatus 1, comprises a reflection type liquid crystal panel 100, and a drive circuit board 500 that supplies drive signals to the liquid crystal panel 100. Depending on cases, a planar light source section serving as a front light may be disposed on the display surface side of the reflection type liquid crystal panel 100. The structural elements common to those in the above-described first embodiment are denoted by like reference numerals, and a detailed description thereof is omitted.

The array substrate 200 and counter substrate 400 include light-transmissive insulation substrates 201 and 401, each of which is formed of glass with a thickness of 0.15 mm or less, preferably 0.1 mm or less (with a thickness of 0.1 mm in the second embodiment).

The pixel electrode 213 is formed of a light-reflective conductive material such as aluminum. The pixel electrode (reflective electrode) 213 is disposed on a resin layer 218. The pixel electrode 213 has random fine projections and depressions on its surface, that is, the surface that faces the counter substrate 400.

Specifically, the resin layer 218 that is an underlayer of the pixel electrode 213 is formed on the interlayer insulation film 217 that is laid over the TFT 211. The surface of the resin layer 218 has a convexo-concave pattern. The pixel electrode 213 is disposed on the resin layer 218 so as to have projections and depressions corresponding to the convexo-concave pattern of the resin layer 218. Thus, light, which is made incident from the counter substrate 400 side, is scattered and reflected, and the viewing angle is widened.

The counter substrate 400 has a color filter layer CF that is disposed on one of major surfaces (i.e. front surface) of the insulation substrate 401. The color filter layer CF is formed of, e.g. a color resist layer, which is colored with, e.g. red, green or blue. Color filter layers with the respective colors are disposed on the associated display pixel sections PX of the corresponding colors.

The counter electrode 403 is disposed on the color filter layer CF so as to face the pixel electrode 213. The counter electrode 403 is formed of a light-transmissive conductive material such as ITO. The alignment film 405 is disposed over the entire effective display region 102 so as to cover the entire counter electrode 403.

The liquid crystal panel 100 includes a polarizer plate 407 that is arranged on an outer surface of the counter substrate 400. The direction of polarization of the polarizer plate 407 is set in accordance with characteristics of the liquid crystal layer 410. Specifically, the polarizer plate 407 is attached to the other major surface (back surface) of the insulation substrate 401 of counter substrate 400 by an adhesive 406. The polarizer plate 407 is formed similarly with the first embodiment.

On the other hand, the liquid crystal panel 100 includes a reinforcement plate 240 that is disposed on the outer surface of the array substrate 200. Specifically, the reinforcement plate 240 is attached to the other major surface (back surface) of the insulation substrate 201 of the array substrate 200 by means of an adhesive layer 241. The reinforcement plate 240 is formed of a resin such as polyether sulfone (PES).

The reinforcement plate 240 and polarizer plate 407 are formed of a resin with flexibility. Specifically, each of the reinforcement plate 240 and polarizer plate 407 is sufficiently extended to the end part of the insulation substrate. In other words, the reinforcement plate 240 has a dimension that is equal to or greater than the dimension of the array substrate 200, and the polarizer plate 407 has a dimension that is equal to or greater than the dimension of the counter substrate 400. Each of the reinforcement plate 240 and polarizer plate 407 is thicker than each of the insulation substrates 201 and 401, and it has a thickness of, e.g. 0.3 mm.

In order to reduce the thickness of the liquid crystal panel 100, each of the insulation substrates 201 and 401 is extremely thinned to, e.g. about 0.1 mm. Even in this case, the provision of the reinforcement plate 240 and polarizer plate 407 can reinforce the insulation substrates 201 and 401. Thereby, even if a bending stress is applied to the liquid crystal panel 100, crack of the insulation substrate 201, 401 can be prevented, and a liquid crystal display apparatus with flexibility, which is not easily broken, can be provided. In particular, since the reinforcement plate and polarizer plate are fully extended to the ends of the insulation substrates, the occurrence of crack and chip in the insulation substrates can remarkably be reduced.

The manufacturing method for the reflection type liquid crystal panel with the above-described structure in the liquid crystal display apparatus is basically the same as the manufacturing method for the light-transmission type liquid crystal panel of the first embodiment. Where the reflection type liquid crystal panel is manufactured, the color filter layer is provided on the second glass substrate side, and the pixel electrode that is provided on the first glass substrate side is formed of a light-reflective conductive material.

In the step illustrated in FIG. 8A, there is no need to remove the reinforcement plate 240 attached to the glass substrate 201. After removing only the reinforcement plate 205 and adhesive layer 223 attached to the glass substrate 401, the polarizer plate 407 may be attached to the outer surface of the glass substrate 401 via the adhesive 406.

Needless to say, other methods as described in connection with the first embodiment are applicable.

In the liquid crystal display apparatus 1 with the above-described reflection type liquid crystal panel 100, light is made incident on the liquid crystal panel 100 via the polarizer plate 407 from the counter substrate 400 side. The incident light is reflected by the pixel electrode 213 toward the counter substrate 400. In this case, the incident light and reflective light is modulated by an electric field produced between the pixel electrode 213 and counter electrode 403. Thus, the modulated light passes selectively through the polarizer plate 407 in units of a display pixel section PX. Thereby, a display image is formed.

According to the liquid crystal display apparatus of the second embodiment, each of the insulation substrates that are structural parts of the array substrate and counter substrate can be extremely thinned. Thus, the reduction in thickness of the liquid crystal panel is achieved. Even in the case where each insulation substrate is extremely thinned, the provision of the polarizer plate and reinforcement plate that are thicker than the insulation substrates can reinforce the insulation substrates. Thereby, it is possible to provide a liquid crystal display apparatus which can prevent damage due to bending, can lessen a variation in cell gap due to bending, and can have flexibility while maintaining a good display quality.

Like the first embodiment, even where the liquid crystal display apparatus is bent with a radius of curvature of 200 mm or less, and further with a radius of curvature of 150 mm, peeling of the flexible wiring board or cutting of lines can be prevented. Moreover, even when the liquid crystal display apparatus is bent, displacement of the spacer is prevented and accordingly occurrence of defective display due to displacement of the spacer can be prevented.

Therefore, it is possible to provide a display apparatus with high reliability and applicability to various uses.

Next, third and fourth embodiments of the present invention will now be described. The third and fourth embodiments relate to structures of display apparatuses with touch panels.

In liquid crystal display apparatuses having touch panels mounted on light-transmission type and reflection type liquid crystal panels, the flexibility of the liquid crystal panel is poorer than that of the touch panel. If pressure acts on the touch panel and deforms it, local pressure also acts on the liquid crystal panel. As a result, a gap therebetween becomes partly less than a desired value, which may lead to defective display and damage to glass substrates. It is necessary, therefore, to keep a sufficient gap between the liquid crystal panel and touch panel so as to prevent their mutual contact. Consequently, the liquid crystal display apparatus that is formed as a module cannot sufficiently be thinned.

In the third and fourth embodiments, a description is given of the structure of the display apparatus that can be reinforced by a touch panel while flexibility is maintained.

Third Embodiment

Figure 9:
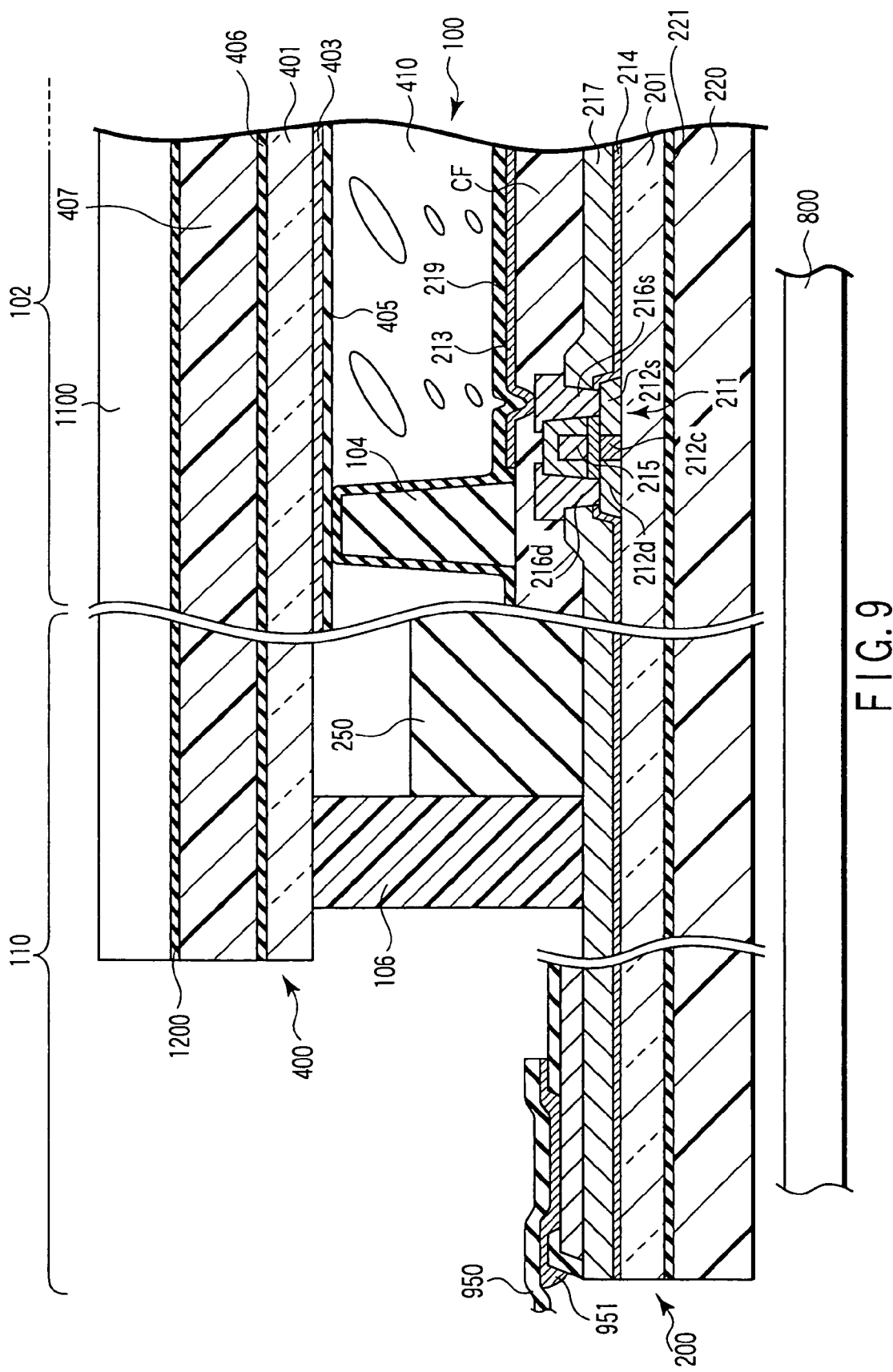
FIG. 9 is a cross-sectional view schematically showing an example of the structure of a light-transmission type liquid crystal panel that is applicable to a liquid crystal display apparatus according to a third embodiment of the invention.

As is shown in FIG. 1 and FIG. 9, a display apparatus according to a third embodiment, that is, a liquid crystal display apparatus 1, comprises a light-transmission type liquid crystal panel 100, a drive circuit board 500 that supplies drive signals to the liquid crystal panel 100, a backlight unit 800 that illuminates the liquid crystal panel 100 from its back side, and a touch panel 1100. The liquid crystal panel 100 and drive circuit board 500 are electrically connected by a flexible wiring board 950. The flexible wiring board 950 is electrically connected to the liquid crystal panel 100 and drive circuit board 500 by, e.g. an anisotropic conductive film (ACF) 951.

Figure 11:
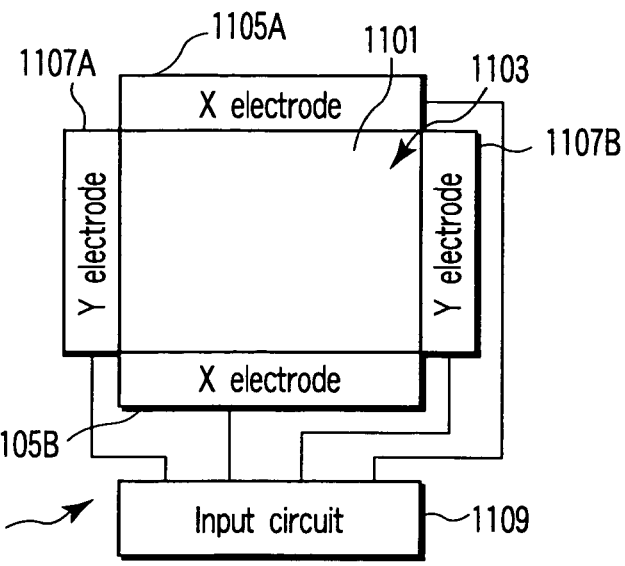
FIG. 11 is a block diagram schematically showing the structure of a touch panel that is mountable on the liquid crystal display apparatuses according to the third and fourth embodiments.

As is shown in FIG. 11, the touch panel 1100 generates an input signal by sensing a contact position within a predetermined region 1101. The touch panel 1100 comprises a conductor layer 1103 that is disposed in the predetermined region 1101, detection electrodes 1105A, 1105B, 1107A and 1107B that are disposed on the four sides of the conductor layer 1103 so as to surround it, and an input circuit 1109 that generates an input signal based on a sense signal detected via these detection electrodes.

The conductor layer 1103 is formed of a light-transmissive conductive material such as ITO. The detection electrodes comprise X electrodes 1105A and 1105B; and Y electrodes 1107A and 1107B. The X electrodes 1105A and 1105B function as a pair of first detection electrodes disposed on opposed two sides of the conductor layer 1103, that is, two sides extending in a horizontal direction X. The Y electrodes 1107A and 1107B function as a pair of second detection electrodes disposed on opposed two sides of the conductor layer 1103, that is, two sides extending in a vertical direction Y at right angles with the X electrodes 1105A and 1105B.

An example of the structure of the touch panel 1100 is described in greater detail. The touch panel 1100 is mounted over the entire surface of the display panel. The touch panel 1100 senses the position of depression (or contact) on the touch panel surface by the user's finger or a pen. This type of touch panel 1100 is an input means that is most widely used in mobile information terminals wherein keyboard input is dispensed with. By mounting the touch panel 1100 on a device such as a notebook personal computer, both keyboard input and touch panel input can be utilized and the functional capability is enhanced.

Figure 12:
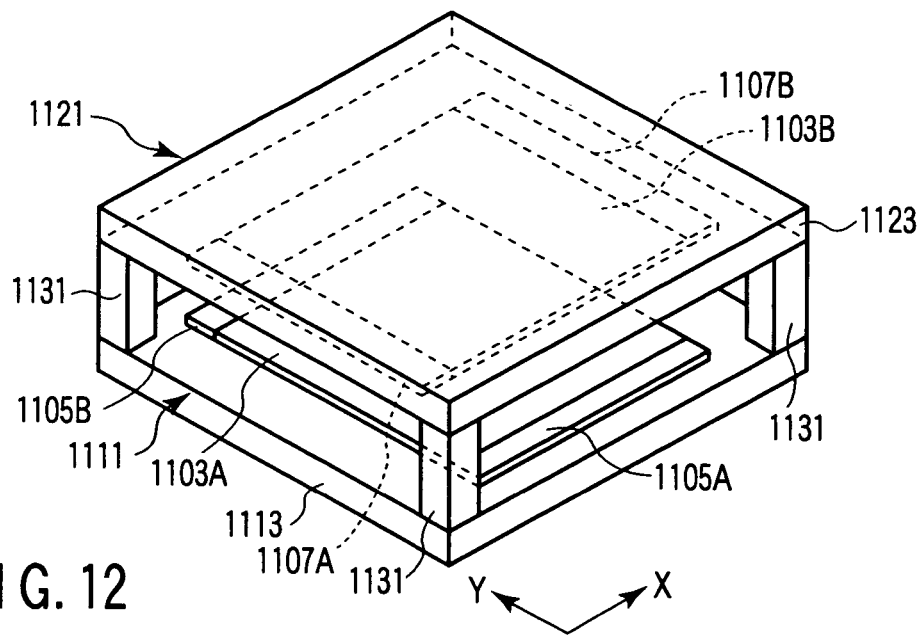
FIG. 12 is a perspective view schematically showing an example of the structure of the touch panel shown in FIG. 11.

As is shown in FIG. 12, for example, the resistance-type touch panel 1100 includes a first substrate 1111, a second substrate 1121, and spacers 1131 functioning as holding means for holding the first substrate 1111 and second substrate 1121 with a predetermined distance.

The first substrate 1111 includes a transparent insulation substrate 1113 of glass, plastic, etc. The transparent insulation substrate 1113 has a conductor layer 1103A that is disposed on the surface thereof, which is opposed to the second substrate 1121, so as to define the predetermined region 1101. The X electrodes 1105A and 1105B are disposed on opposed two sides of the conductor layer 1103A.

The second substrate 1121 includes a transparent insulation substrate 1123 of glass, plastic, etc. The transparent insulation substrate 1123 has a conductor layer 1103B that is disposed on the surface thereof, which is opposed to the first substrate 1111, so as to define the predetermined region 1101. The Y electrodes 1107A and 1107B are disposed on opposed two sides of the conductor layer 1103B.

Figure 13:
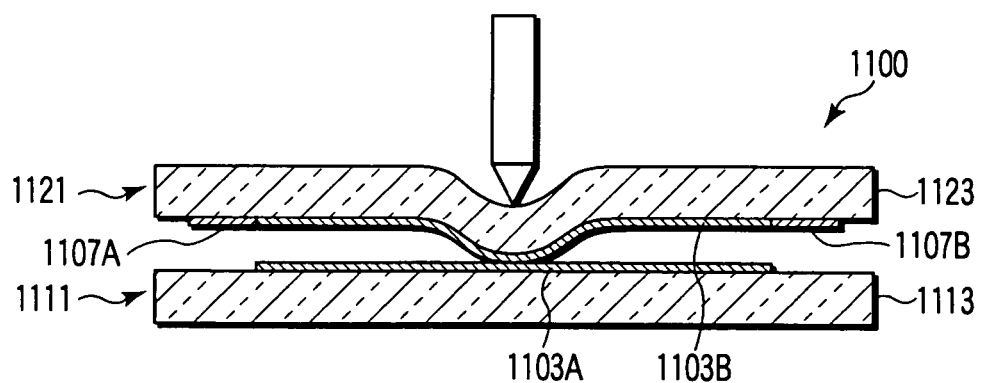
FIG. 13 is a view for explaining a touch operation on the touch panel shown in FIG. 12.

In the touch panel 1100 with the above structure, as shown in FIG. 13, the second substrate 1121 is recessed by depression of the upper side of the second substrate 1121 by means of, a pen. Consequently, the conductor layer 1103B disposed on the second substrate 1121 comes in contact with the conductor layer 1103A disposed on the first substrate 1111, thus effecting electric short-circuit.

Figure 14:
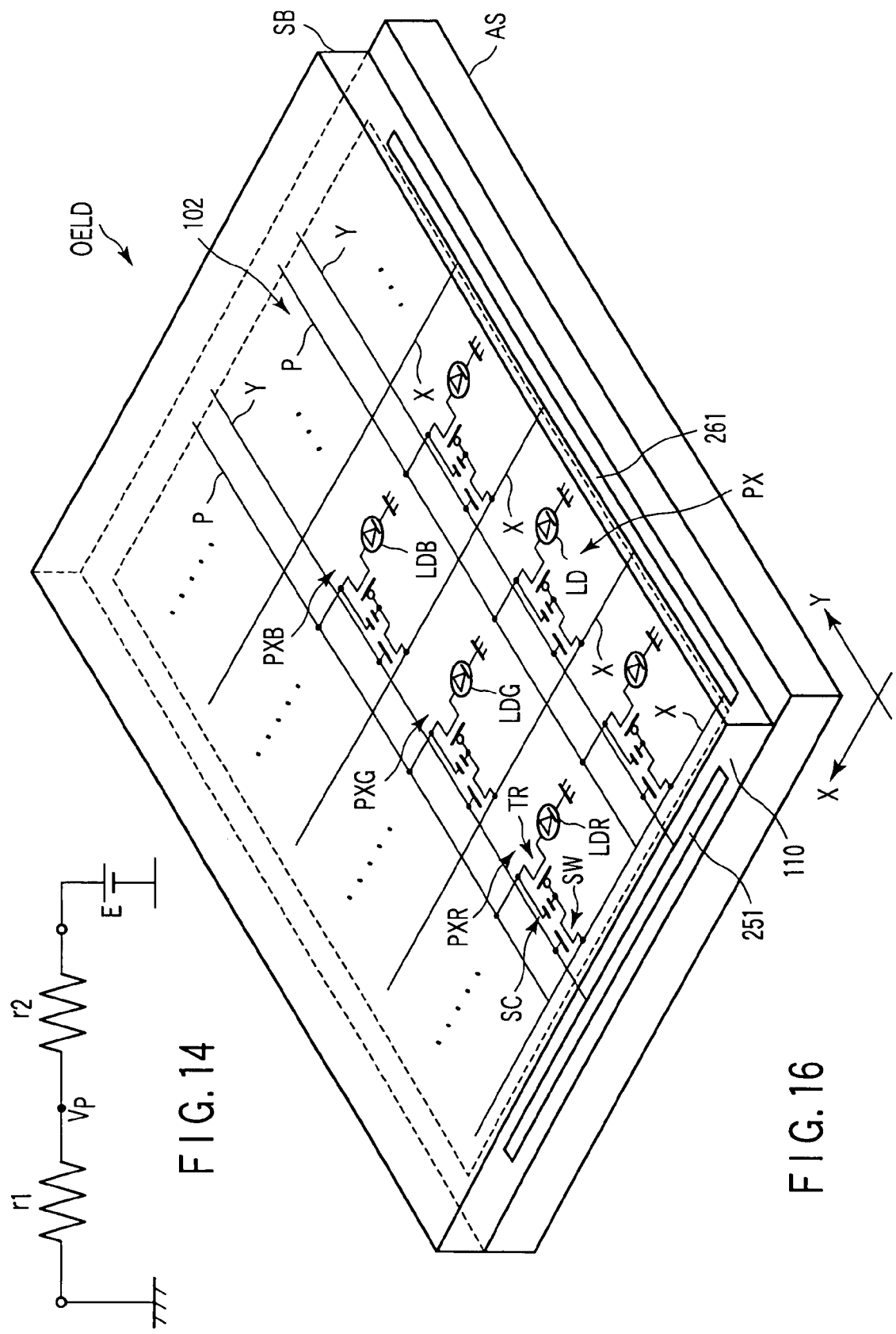
FIG. 14 shows an equivalent circuit associated with the touch operation on the touch panel shown in FIG. 13.

In this case, as shown in FIG. 14, a DC voltage E is applied to the Y electrodes 1107A and 1107B of the second substrate 1121, and a potential Vp at a position, where short-circuit has occurred at the conductor layer 1103A on the first substrate 1111, that is, at a position of the depression by the pen, is detected. Thereby, a position in the X-direction is found.

Similarly, a DC voltage E is applied to the X electrodes 1105A and 1105B of the first substrate 1111, and a potential Vp at a position, where short-circuit has occurred at the conductor layer 1103B on the second substrate 1121, that is, at a position of the depression by the pen, is detected. Thereby, a position in the Y-direction is found.

Needless to say, touch panels other than the above-described resistance-type touch panel are applicable to the liquid crystal display apparatus 1.

As is shown in FIG. 1 and FIG. 9, the liquid crystal panel 100 has an effective display region 102 with a diagonal size of 12.1 inches. The effective display region 102 includes a plurality of display pixel sections PX arranged in a matrix. The liquid crystal panel 100 includes an array substrate 200, a counter electrode 400, and a liquid crystal layer 410 that is held between the array substrate 200 and counter substrate 400, with alignment films interposed, respectively.

The array substrate 200 and counter substrate 400 are configured similarly with the first embodiment. Specifically, in order to achieve further reduction in thickness, the array substrate 200 includes a light-transmissive insulation substrate 201 that is formed of glass with a thickness of 0.15 mm or less, preferably 0.1 mm or less (with a thickness of 0.1 mm in the third embodiment). The counter substrate 400 includes a light-transmissive insulation substrate 401 that is formed of glass with a thickness of 0.15 mm or less, preferably 0.1 mm or less (with a thickness of 0.1 mm in the third embodiment).

The liquid crystal panel 100 includes a pair of polarizer plates 220 and 407 that are arranged on an outer surface of the array substrate 200 and an outer surface of the counter substrate 400, respectively. The directions of polarization of the polarizer plates 220 and 407 are set in accordance with characteristics of the liquid crystal layer 410. Specifically, the polarizer plate 220 is attached to the other major surface (back surface) of the insulation substrate 201 of array substrate 200 by an adhesive 221. The polarizer plate 407 is attached to the other major surface (back surface) of the insulation substrate 401 of counter substrate 400 by an adhesive 406.

The polarizer plates 220 and 407 are formed of a resin with flexibility. Each of the polarizer plates 220 and 407 is sufficiently extended to the end part of the insulation substrate. In other words, the polarizer plate 220 has a dimension that is equal to or greater than the dimension of the array substrate 200, and the polarizer plate 407 has a dimension that is equal to or greater than the dimension of the counter substrate 400. In the third embodiment, the end of the insulation substrate is made to correspond to the end of the polarizer plate. Alternatively, the end of the polarizer plate may extend beyond the end of the insulation substrate so as to cover the corner of the insulation substrate. If the end of the touch panel 1100 corresponds in position to the end of the insulation substrate or extends beyond the end of the insulation substrate, the end of the polarizer plate may retreat from the end of the insulation substrate. Conversely, if the end of the polarizer plate corresponds in position to the end of the insulation substrate or extends beyond the end of the insulation substrate, the end of the touch panel 1100 may retreat from the end of the insulation substrate. In short, if one of the polarizer plate attached to the insulation substrates and the touch panel corresponds in position to the end of the insulation substrate or extends beyond the end of the insulation substrate, crack, chip or the like of the end part of the insulation substrate can fully be prevented.

Of the polarizer plates 220 and 407, at least the polarizer plate 220 on the array substrate 200 side is thicker than the insulation substrate 201 of the array substrate 200, and it has a thickness of, e.g. 0.3 mm. Similarly, the polarizer plate 407 on the counter substrate 400 side may be thicker than the insulation substrate 401 of the counter substrate 400, and it has a thickness of, e.g. 0.3 mm.

The touch panel 1100 is provided on the polarizer plate 407 on the counter substrate 400 side. Specifically, the touch panel 1100 (the insulation substrate 1113 of the first substrate 1111 of touch panel 1100 in the third embodiment) is attached to the polarizer plate 407 on the counter substrate 400 side by means of an adhesive 1200. The touch panel 1100 has such flexibility that it is recessed by depression by means of a pen, etc. The touch panel 1100 has a dimension that is equal to or greater than the dimension of the counter substrate 400. The touch panel 1100 is fully extended to the end of the insulation substrate.

With the above-described structure, in order to reduce the thickness of the liquid crystal panel 100, each of the insulation substrates 201 and 401 is extremely thinned to, e.g. about 0.1 mm. Even in this case, the provision of the polarizer plates 220 and 407 and touch panel 1100 can reinforce the insulation substrates 201 and 401. Thereby, even if a bending stress is applied to the liquid crystal panel 100, crack of the insulation substrate 201, 401 can be prevented, and a liquid crystal display apparatus with flexibility, which is not easily broken, can be provided. In particular, since the polarizer plate and touch panel are fully extended to the ends of the insulation substrates, the occurrence of crack and chip in the insulation substrates can remarkably be reduced.

In addition, since the liquid crystal panel is made flexible, when pressure acts on the touch panel and the touch panel deforms, the liquid crystal panel similarly deforms and breakage of the insulation substrate is prevented. Moreover, the columnar spacer is integrally formed on the array substrate with a desired density. Thus, even when the liquid crystal panel deforms, occurrence of partial display defect can be prevented. Therefore, there is no need to keep a gap between the liquid crystal panel and touch panel, and the liquid crystal display apparatus that is formed as a module can sufficiently be thinned.

In the third embodiment, the touch panel is attached to the polarizer plate. Alternatively, the touch panel may be disposed on the insulation substrate, and the polarizer plate may be attached to the touch panel.

The manufacturing method for the light-transmission type liquid crystal panel with the above-described structure in the liquid crystal display apparatus is basically the same as the manufacturing method for the light-transmission type liquid crystal panel of the first embodiment. In the third embodiment, as shown in FIG. 8B, a polarizer plate 220 with a thickness of about 0.3 mm is attached to the outer surface of the glass substrate 201 via an adhesive 221, and a polarizer plate 407 with a thickness of about 0.3 mm is attached to the outer surface of the glass substrate 401 via an adhesive 406. Thereafter, the insulation substrate 1113 of the first substrate 1111 of the touch panel 1100 is attached to the surface of the polarizer plate 407 via the adhesive 1200.

Needless to say, other methods as described in connection with the first embodiment are applicable.

In the liquid crystal display apparatus 1 with the above-described light-transmission type liquid crystal panel 100, light emitted from the backlight unit 800 is made incident on the array substrate 200 of the liquid crystal panel 100 via the polarizer plate 220. The light incident on the liquid crystal panel 100 is modulated by the liquid crystal layer 410 that is controlled by an electric field produced between the pixel electrode 213 and counter electrode 403. Thus, the modulated light passes selectively through the polarizer plate 407 of the counter substrate 400 in units of a display pixel section PX. The light emerging from the polarizer plate 407 passes through the touch panel 1100, and thus a display image is formed.

According to the liquid crystal display apparatus of the third embodiment, each of the insulation substrates that are structural parts of the array substrate and counter substrate can be extremely thinned. Thus, the reduction in thickness of the liquid crystal panel is achieved. Since the touch panel and liquid crystal panel are attached together, the liquid crystal display apparatus that is formed as a module can be made thinner, compared to the case where a gap is provided between the touch panel and the liquid crystal panel.

Even in the case where each insulation substrate is extremely thinned, the provision of the polarizer plate and touch panel that are thicker than the insulation substrates can reinforce the insulation substrates. Thereby, it is possible to provide a liquid crystal display apparatus which has such flexibility as to prevent damage due to bending, and also has the touch panel.

Since the attachment of the touch panel can reinforce the insulation substrate, the polarizer plate provided on the touch panel side substrate does not need to have a thickness necessary for reinforcing the insulation substrate. Therefore, further reduction in thickness can be achieved while high durability is provided.

Moreover, in this embodiment, parts of the drive circuit are integrally formed on the array substrate. Thus, the number of locations for connection to the external circuit can be reduced. In the case where the drive circuit is not disposed, the number of locations for connection, which corresponds to the number of signal lines, e.g. 1024×3, are necessary, whereas only 48 locations for connection are required in this embodiment. In addition, in the prior art, the locations for connection are set at least along two sides that are perpendicular to each other. In this embodiment, the 48 locations for connection are arranged along only a part of one side of the liquid crystal panel.

Hence, the area for connection of the flexible wiring board that connects the liquid crystal panel and drive circuit substrate can be reduced. Furthermore, even when the liquid crystal display apparatus is bent, peeling of the flexible wiring board or cutting of lines can be prevented.

The gap between the array substrate and counter substrate is provided by the columnar spacer that is integral with the array substrate. Thus, even when the liquid crystal display apparatus is bent or the touch panel is depressed, displacement of the spacer is prevented and accordingly occurrence of defective display due to displacement of the spacer can be prevented. The columnar spacer can be disposed with a desired density according to a design value. Therefore, the gap does not greatly vary due to bending, and a uniform display quality can be obtained.

Therefore, it is possible to provide a display apparatus with high reliability and applicability to various uses, which, for example, can be used in a bent state.

Fourth Embodiment

Figure 10:
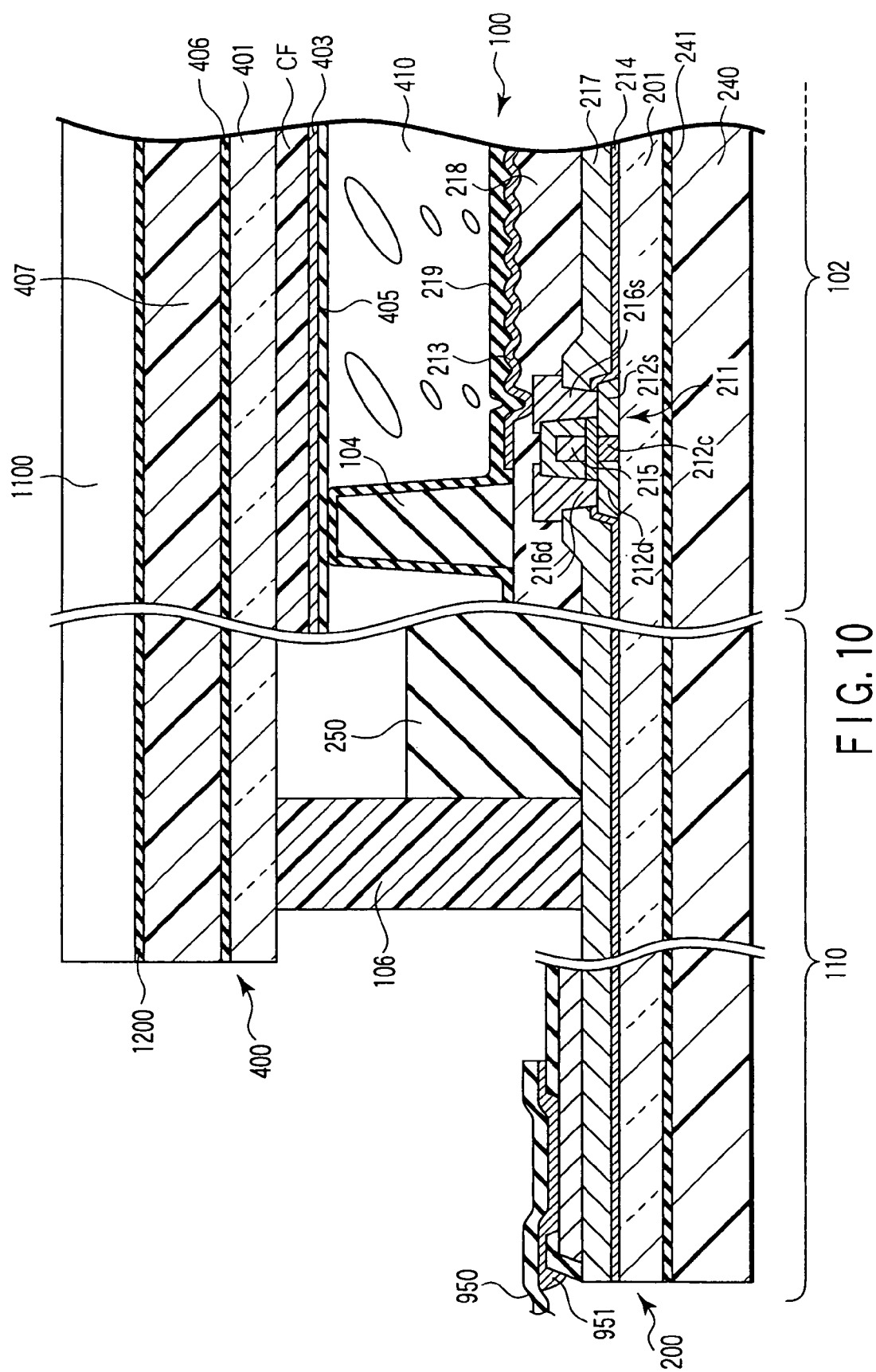
FIG. 10 is a cross-sectional view schematically showing an example of the structure of a light-reflection type liquid crystal panel that is applicable to a liquid crystal display apparatus according to a fourth embodiment of the invention.

As is shown in FIG. 1 and FIG. 10, a display apparatus according to a fourth embodiment, that is, a liquid crystal display apparatus 1, comprises a reflection type liquid crystal panel 100, a drive circuit board 500 that supplies drive signals to the liquid crystal panel 100, and a touch panel 1100. Depending on cases, a planar light source section serving as a front light may be disposed on the display surface side of the reflection type liquid crystal panel 100. The structural elements common to those in the above-described third embodiment are denoted by like reference numerals, and a detailed description thereof is omitted.

The array substrate 200 and counter substrate 400 are configured similarly with the above-described third embodiment. Specifically, each of the light-transmissive insulation substrates 201 and 401 of the array substrate 200 and counter substrate 400 is formed of glass with a thickness of 0.15 mm or less, preferably 0.1 mm or less (with a thickness of 0.1 mm in the fourth embodiment).

The liquid crystal panel 100 includes a polarizer plate 407 that is arranged on an outer surface of the counter substrate 400. The direction of polarization of the polarizer plate 407 is set in accordance with characteristics of the liquid crystal layer 410. Specifically, the polarizer plate 407 is attached to the other major surface (back surface) of the insulation substrate 401 of counter substrate 400 by an adhesive 406. The polarizer plate 407 is formed similarly with the third embodiment.

On the other hand, the liquid crystal panel 100 includes a reinforcement plate 240 that is disposed on the outer surface of the array substrate 200. Specifically, the reinforcement plate 240 is attached to the other major surface (back surface) of the insulation substrate 201 of the array substrate 200 by means of an adhesive layer 241. The reinforcement plate 240 is formed of a resin such as polyether sulfone (PES).

The reinforcement plate 240 and polarizer plate 407 are formed of a resin with flexibility. Specifically, each of the reinforcement plate 240 and polarizer plate 407 is sufficiently extended to the end part of the insulation substrate. In other words, the reinforcement plate 240 has a dimension that is equal to or greater than the dimension of the array substrate 200, and the polarizer plate 407 has a dimension that is equal to or greater than the dimension of the counter substrate 400. Each of the reinforcement plate 240 and polarizer plate 407 is thicker than each of the insulation substrates 201 and 401, and it has a thickness of, e.g. 0.3 mm.

Like the third embodiment, the touch panel 1100 is provided on the polarizer plate 407.

In the liquid crystal display apparatus with the above-described structure, in order to reduce the thickness of the liquid crystal panel 100, each of the insulation substrates 201 and 401 is extremely thinned to, e.g. about 0.1 mm. Even in this case, the provision of the reinforcement plate 240, polarizer plate 407 and touch panel 1100 can reinforce the insulation substrates 201 and 401. Thereby, even if a bending stress is applied to the liquid crystal panel 100 via the touch panel 1100, crack of the insulation substrate 201, 401 can be prevented, and a liquid crystal display apparatus with flexibility, which is not easily broken, can be provided. In particular, since the polarizer plate and touch panel are fully extended to the ends of the insulation substrates, the occurrence of crack and chip in the insulation substrates can remarkably be reduced.

In addition, since the liquid crystal panel is made flexible, when pressure acts on the touch panel and the touch panel deforms, the liquid crystal panel similarly deforms and breakage of the insulation substrate is prevented. Moreover, the columnar spacer is integrally formed on the array substrate with a desired density. Thus, even when the liquid crystal panel deforms, occurrence of partial display defect can be prevented. Therefore, there is no need to keep a gap between the liquid crystal panel and touch panel, and the liquid crystal display apparatus that is formed as a module can sufficiently be thinned.

In the fourth embodiment, the touch panel is attached to the polarizer plate. Alternatively, the touch panel may be disposed on the insulation substrate, and the polarizer plate may be attached to the touch panel.

The manufacturing method for the reflection type liquid crystal panel with the above-described structure in the liquid crystal display apparatus is basically the same as the manufacturing method of the third embodiment. In the fourth embodiment, as shown in FIG. 8B, a polarizer plate 220 with a thickness of about 0.3 mm is attached to the outer surface of the glass substrate 201 via an adhesive 221, and a polarizer plate 407 with a thickness of about 0.3 mm is attached to the outer surface of the glass substrate 401 via an adhesive 406. Thereafter, the insulation substrate 1113 of the first substrate 1111 of the touch panel 1100 is attached to the surface of the polarizer plate 407 via the adhesive 1200.

Needless to say, other methods as described in connection with the first embodiment are applicable.

In the liquid crystal display apparatus 1 with the above-described reflection type liquid crystal panel 100, light passes through the touch panel 1100 and is made incident on the liquid crystal panel 100 via the polarizer plate 407 from the counter substrate 400 side. The incident light is reflected by the pixel electrode 213 toward the counter substrate 400. In this case, the incident light and reflective light is modulated by an electric field produced between the pixel electrode 213 and counter electrode 403. Thus, the modulated light passes selectively through the polarizer plate 407 in units of a display pixel section PX. The emerging from the polarizer plate 407 passes through the touch panel 1100. Thereby, a display image is formed.

According to the liquid crystal display apparatus of the fourth embodiment, each of the insulation substrates that are structural parts of the array substrate and counter substrate can be extremely thinned. Thus, the reduction in thickness of the liquid crystal panel is achieved. Even in the case where each insulation substrate is extremely thinned, the provision of the polarizer plate, reinforcement plate and touch panel can reinforce the insulation substrates. Thereby, it is possible to provide a liquid crystal display apparatus which has such flexibility as to prevent damage due to bending.

Like the third embodiment, even where the liquid crystal display apparatus is bent, peeling of the flexible wiring board or cutting of lines can be prevented. Moreover, even when the liquid crystal display apparatus is bent, displacement of the spacer is prevented and accordingly occurrence of defective display due to displacement of the spacer can be prevented.

Therefore, it is possible to provide a display apparatus with high reliability and applicability to various uses.

Next, a fifth embodiment of the present invention will now be described. The fifth embodiment relates to a structure of a display apparatus that is provided with a backlight unit.

A liquid crystal display apparatus including a light-transmission type liquid crystal panel requires a backlight unit for illuminating the liquid crystal panel. The backlight unit is disposed on the back side of the liquid crystal panel. This makes it difficult to reduce the thickness of the modularized liquid crystal display apparatus.

In the fifth embodiment, a description is given of the structure of the display apparatus that can be reinforced by a backlight unit while flexibility is maintained.

Fifth Embodiment

Figure 15:
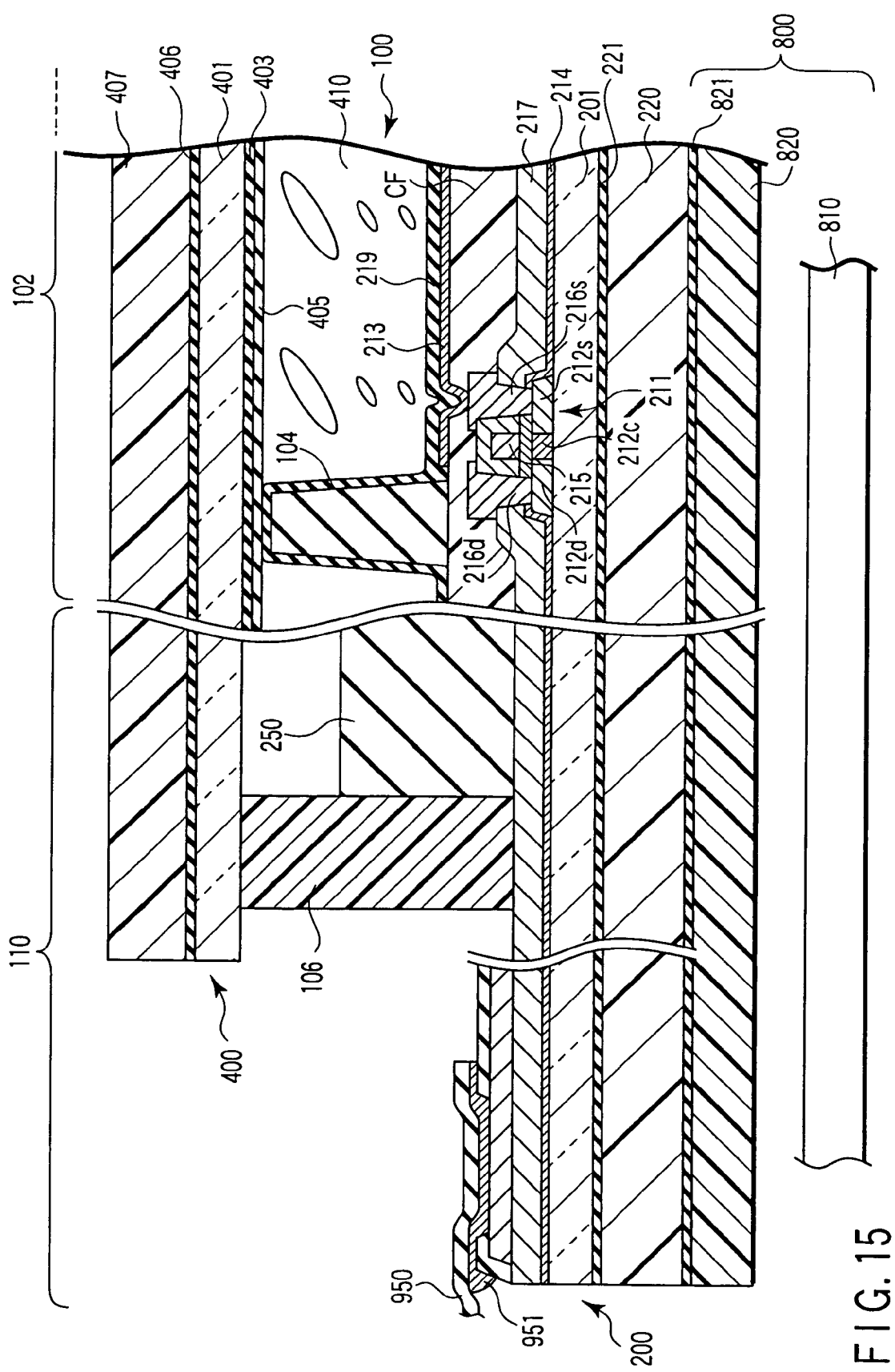
FIG. 15 is a cross-sectional view schematically showing an example of the structure of a light-transmission type liquid crystal panel that is applicable to a liquid crystal display apparatus according to a fifth embodiment of the invention.

As is shown in FIG. 1 and FIG. 15, a display apparatus according to a fifth embodiment, that is, a liquid crystal display apparatus 1, comprises a light-transmission type liquid crystal panel 100, a drive circuit board 500 that supplies drive signals to the liquid crystal panel 100, and a backlight unit 800 that illuminates the liquid crystal panel 100 from its back side. The liquid crystal panel 100 and drive circuit board 500 are electrically connected by a flexible wiring board 950. The flexible wiring board 950 is electrically connected to the liquid crystal panel 100 and drive circuit board 500 by, e.g. an anisotropic conductive film (ACF) 951.

The backlight unit 800 comprises a planar light source section 810, and at least one optical sheet 820 that imparts predetermined optical characteristics to light that is emitted from the planar light source section 810. The planar light source section 810 includes a light-guide plate having the same dimensions as the liquid crystal panel 100, a tubular light source disposed at an end face of the light-guide plate, and a reflection plate that guides light emitted from the tubular light source to the end face of the light-guide plate. The optical sheet 820 is composed of a prism sheet that converges light emitted from the planar light source section 810, or a diffusion sheet that diffuses the light.

The liquid crystal panel 100 has an effective display region 102 that includes a plurality of display pixel sections PX arranged in a matrix. The liquid crystal panel 100 includes an array substrate 200, a counter electrode 400, and a liquid crystal layer 410 that is held between the array substrate 200 and counter substrate 400, with alignment films interposed, respectively.

The array substrate 200 and counter substrate 400 are configured similarly with the first embodiment. Specifically, in order to achieve further reduction in thickness, the array substrate 200 includes a light-transmissive insulation substrate 201 that is formed of glass with a thickness of 0.15 mm or less, preferably 0.1 mm or less (with a thickness of 0.1 mm in the fifth embodiment). The counter substrate 400 includes a light-transmissive insulation substrate 401 that is formed of glass with a thickness of 0.15 mm or less, preferably 0.1 mm or less (with a thickness of 0.1 mm in the fifth embodiment).

The liquid crystal panel 100 includes a pair of polarizer plates 220 and 407 that are arranged on an outer surface of the array substrate 200 and an outer surface of the counter substrate 400, respectively. The directions of polarization of the polarizer plates 220 and 407 are set in accordance with characteristics of the liquid crystal layer 410. Specifically, the polarizer plate 220 is attached to the other major surface (back surface) of the insulation substrate 201 of array substrate 200 by an adhesive 221. The polarizer plate 407 is attached to the other major surface (back surface) of the insulation substrate 401 of counter substrate 400 by an adhesive 406.

The polarizer plates 220 and 407 are formed of a resin with flexibility. Each of the polarizer plates 220 and 407 is sufficiently extended to the end part of the insulation substrate. In other words, the polarizer plate 220 has a dimension that is equal to or greater than the dimension of the array substrate 200, and the polarizer plate 407 has a dimension that is equal to or greater than the dimension of the counter substrate 400. In the fifth embodiment, the end of the insulation substrate is made to correspond to the end of the polarizer plate. Alternatively, the end of the polarizer plate may extend beyond the end of the insulation substrate so as to cover the corner of the insulation substrate. If the end of the backlight unit 800 corresponds in position to the end of the insulation substrate or extends beyond the end of the insulation substrate, the end of the polarizer plate may retreat from the end of the insulation substrate. Conversely, if the end of the polarizer plate corresponds in position to the end of the insulation substrate or extends beyond the end of the insulation substrate, the backlight unit 800, for example, the optical sheet 820, may retreat from the end of the insulation substrate. In short, if one of the polarizer plate attached to the insulation substrate and the backlight unit corresponds in position to the end of the insulation substrate or extends beyond the end of the insulation substrate, crack, chip or the like of the end part of the insulation substrate can fully be prevented.

Of the polarizer plates 220 and 407, at least the polarizer plate 407 on the counter substrate 400 side is thicker than the insulation substrate 401 of the counter substrate 400, and it has a thickness of, e.g. 0.3 mm. Because of the relation with the thickness of the optical sheet to be described later, if the total thickness is greater than the thickness of the insulation substrate 401, a minimum reinforcement effect can be obtained. Similarly, the polarizer plate 220 on the array substrate 200 side may be thicker than the insulation substrate 201 of the array substrate 200, and it has a thickness of, e.g. 0.3 mm.

The backlight unit 800 is provided on the polarizer plate 220 on the array substrate 200 side. Specifically, the backlight unit 800 (the optical sheet 820 of the backlight unit 800 in the fifth embodiment) is attached to the polarizer plate 220 on the array substrate 200 side by means of an adhesive 821. The optical sheet 820 is formed of, e.g. D120 (manufactured by TSUJIDEN) with a diffusion function. The optical sheet 820 is formed of a flexible resin and has a dimension that is equal to or greater than the dimension of the array substrate 200. The optical sheet 820 is fully extended to the end of the insulation substrate. The optical sheet 820 is thicker than the insulation substrate 201, and it has a thickness of, e.g. 0.12 mm. In the case where the optical sheet 820 with this thickness is attached to the polarizer plate 220, the polarizer plate 220 is not necessarily required to have a thickness greater than the thickness of the insulation substrate 201, as mentioned above.

With the above-described structure, in order to reduce the thickness of the liquid crystal panel 100, each of the insulation substrates 201 and 401 is extremely thinned to, e.g. about 0.1 mm. Even in this case, the provision of the polarizer plates 220 and 407 and backlight unit 800 (in particular, the optical sheet 820) can reinforce the insulation substrates 201 and 401. Thereby, even if a bending stress is applied to the liquid crystal panel 100, crack of the insulation substrate 201, 401 can be prevented, and a liquid crystal display apparatus with flexibility, which is not easily broken, can be provided. In particular, since the polarizer plates and backlight unit are fully extended to the ends of the insulation substrates, the occurrence of crack and chip in the insulation substrates can remarkably be reduced.

Moreover, the columnar spacer is integrally formed on the array substrate with a desired density. Thus, even when the liquid crystal panel deforms, occurrence of partial display defect can be prevented. Therefore, there is no need to keep a gap between the liquid crystal panel and backlight unit, and the liquid crystal display apparatus that is modularized can sufficiently be thinned.

The manufacturing method for the light-transmission type liquid crystal panel with the above-described structure in the liquid crystal display apparatus is basically the same as the manufacturing method for the light-transmission type liquid crystal panel of the first embodiment. In the fifth embodiment, as shown in FIG. 8B, a polarizer plate 220 with a thickness of about 0.3 mm is attached to the outer surface of the glass substrate 201 via an adhesive 221, and a polarizer plate 407 with a thickness of about 0.3 mm is attached to the outer surface of the glass substrate 401 via an adhesive 406. Thereafter, the optical sheet 820 of the backlight unit 800 is attached to the surface of the polarizer plate 220 via the adhesive 821.

Needless to say, other methods as described in connection with the first embodiment are applicable.

In the liquid crystal display apparatus 1 with the above-described light-transmission type liquid crystal panel 100, light emitted from the planar light source section 810 of backlight unit 800 is provided with predetermined optical characteristics by the optical sheet 820. The light is then made incident on the array substrate 200 of the liquid crystal panel 100 via the polarizer plate 220. The light incident on the liquid crystal panel 100 is modulated by the liquid crystal layer 410 that is controlled by an electric field produced between the pixel electrode 213 and counter electrode 403. Thus, the modulated light passes selectively through the polarizer plate 407 of the counter substrate 400 in units of a display pixel section PX. Thus, a display image is formed.

According to the liquid crystal display apparatus of the fifth embodiment, each of the insulation substrates that are structural parts of the array substrate and counter substrate can be extremely thinned. Thus, the reduction in thickness of the liquid crystal panel is achieved. Since the backlight unit and liquid crystal panel are attached together, the modularized liquid crystal display apparatus can be made thinner, compared to the case where a gap is provided between the backlight unit and the liquid crystal panel.

Even in the case where each insulation substrate is extremely thinned, the provision of the polarizer plate and backlight unit (in particular, the optical sheet of the backlight unit) that are thicker than the insulation substrates can reinforce the insulation substrates. Thereby, it is possible to provide a liquid crystal panel which has such flexibility as to prevent damage due to bending.

Since the attachment of the backlight unit can reinforce the insulation substrate, the polarizer plate provided on the backlight unit side substrate does not need to have a thickness necessary for reinforcing the insulation substrate. Therefore, further reduction in thickness can be achieved while high durability is provided.

Moreover, in this embodiment, parts of the drive circuit are integrally formed on the array substrate. Thus, the number of locations for connection to the external circuit can be reduced. In the case where the drive circuit is not disposed, the number of locations for connection, which corresponds to the number of signal lines, e.g. 1024×3, are necessary, whereas only 48 locations for connection are required in this embodiment. In addition, in the prior art, the locations for connection are set at least along two sides that are perpendicular to each other. In this embodiment, the 48 locations for connection are arranged along only a part of one side of the liquid crystal panel.

Hence, the area for connection of the flexible wiring board that connects the liquid crystal panel and drive circuit substrate can be reduced. Furthermore, even when the liquid crystal display apparatus is bent, peeling of the flexible wiring board or cutting of lines can be prevented.

The gap between the array substrate and counter substrate is provided by the columnar spacer that is integral with the array substrate. Thus, even when the liquid crystal display apparatus is bent, displacement of the spacer is prevented and accordingly occurrence of defective display due to displacement of the spacer can be prevented. The columnar spacer can be disposed with a desired density according to a design value. Therefore, the gap does not greatly vary due to bending, and a uniform display quality can be obtained.

Therefore, it is possible to provide a display apparatus with high reliability and applicability to various uses, which, for example, can be used in a bent state.

In the fifth embodiment, the diffusion plate is attached as the optical sheet 820 of the backlight unit 800, thereby to reinforce the insulation substrate 201. Alternatively, other various optical sheets such as a prism sheet or a selective-reflection plate may be attached. In addition, a plurality of optical sheets may be attached to the insulation substrate 201, thereby to reinforce it. In this case, it should suffice if the entire thickness of the optical sheet to be attached is greater than the thickness of the insulation substrate 201. In a case where a backlight unit that is configured to permit omission of the optical sheet is applied, the planar light source section 810 may directly be attached to the polarizer plate 220 by the adhesive 821. With this structure, further reduction in thickness can be realized.

In the above-described embodiment, the polarizer plate 220 and optical sheet 820 are successively attached to the insulation substrate 201. Alternatively, an optical sheet functioning also as a polarizer plate may directly be attached to the insulation substrate 201. In this case, it should suffice if the optical sheet has a thickness greater than the thickness of the insulation substrate 201.

In the first to fifth embodiments, the light-transmission type and reflection type liquid crystal display apparatuses have been described as the display apparatus. Needless to say, the present invention is applicable to a semi-transmissive liquid crystal display apparatus wherein each pixel section is provided with a light-transmissive section and a light-reflective section. This invention is also applicable to a self-light-emitting display apparatus with a self-light-emitting device, as another type of display apparatus. In a sixth embodiment to be described below, an organic electroluminescent display apparatus (OELD), for instance, is employed as a self-light-emitting display apparatus that is applicable to the present invention.

Sixth Embodiment

As is shown in FIG. 16 through FIG. 19, a display apparatus according to a sixth embodiment of the invention, that is, an OELD, comprises an array substrate AS having an effective display region 102 that displays an image, and a sealing body SB that seals at least the effective display region 102 of the array substrate AS. The effective display region 102 comprises a plurality of display pixel sections PX (R, G, B) arranged in a matrix.

Each display pixel section PX (R, G, B) includes a pixel switch SW having a function of electrically separating an on-state pixel and an off-state pixel and holding a video signal in the on-state pixel; a drive transistor TR that supplies a desired drive current to a display device on the basis of the video signal that is supplied via the pixel switch SW; and a storage capacitor SC that stores a gate-source potential of the drive transistor TR for a predetermined time period. The pixel switch SW and drive transistor TR are composed of, e.g. thin-film transistors, and include polysilicon (p-Si) films as active layers. Each display pixel section PX (R, G, B) includes an organic EL device LD (R, G, B) as the display device. Specifically, a red pixel PXR includes an organic EL device LDR that emits red light, a green pixel PXG includes an organic EL device LDG that emits green light, and a blue pixel PXB includes an organic EL device LDB that emits blue light.

Each organic EL device LD (R, G, B) is basically the same. The organic EL device LD comprises a first electrode FE that is formed in an insular shape in each of the display pixel sections PX arranged in a matrix; a second electrode SE that is disposed to face the first electrode FE and formed commonly for all the display pixel sections PX; and an organic active layer OA that is held between the first electrode FE and second electrode SE.

The array substrate AS includes a plurality of scan lines Y disposed along the row direction (Y direction in FIG. 16) of the display pixel sections PX; a plurality of signal lines X disposed along a direction (X direction in FIG. 16) substantially perpendicular to the scan lines Y; and power supply lines P that supply power to the first electrode FE of the organic EL device LD.

The power supply lines P are connected to a first electrode power supply line (not shown) that is disposed on a peripheral part of the effective display region 102. The second electrode SE of the organic EL device LD is connected to a second electrode power supply line (not shown) that is disposed on a peripheral part of the effective display region 102 and supplies a common potential, e.g. a ground potential in this embodiment.

The array substrate AS has a drive circuit section 110 on a peripheral part of the effective display region 102, and the drive circuit section 110 includes a scan line drive circuit 251 that supplies scan pulses to the scan lines Y and a signal line drive circuit 261 that supplies video signals to the signal lines X. All scan lines Y are connected to the scan line drive circuit 251, and all signal lines X are connected to the signal line drive circuit 261.

The pixel switch SW is disposed near an intersection of the scan line Y and signal line X. The gate electrode of the pixel switch SW is connected to the scan line Y, the source electrode thereof is connected to the signal line X, and the drain electrode thereof is connected to one of the electrodes of the storage capacitor SC and to the gate electrode of the drive transistor TR. The source electrode of the drive transistor TR is connected to the other electrode of the storage capacitor SC and to the power supply line P. The drain electrode of the drive transistor TR is connected to the first electrode FE of the organic EL device LD.

Figure 17:
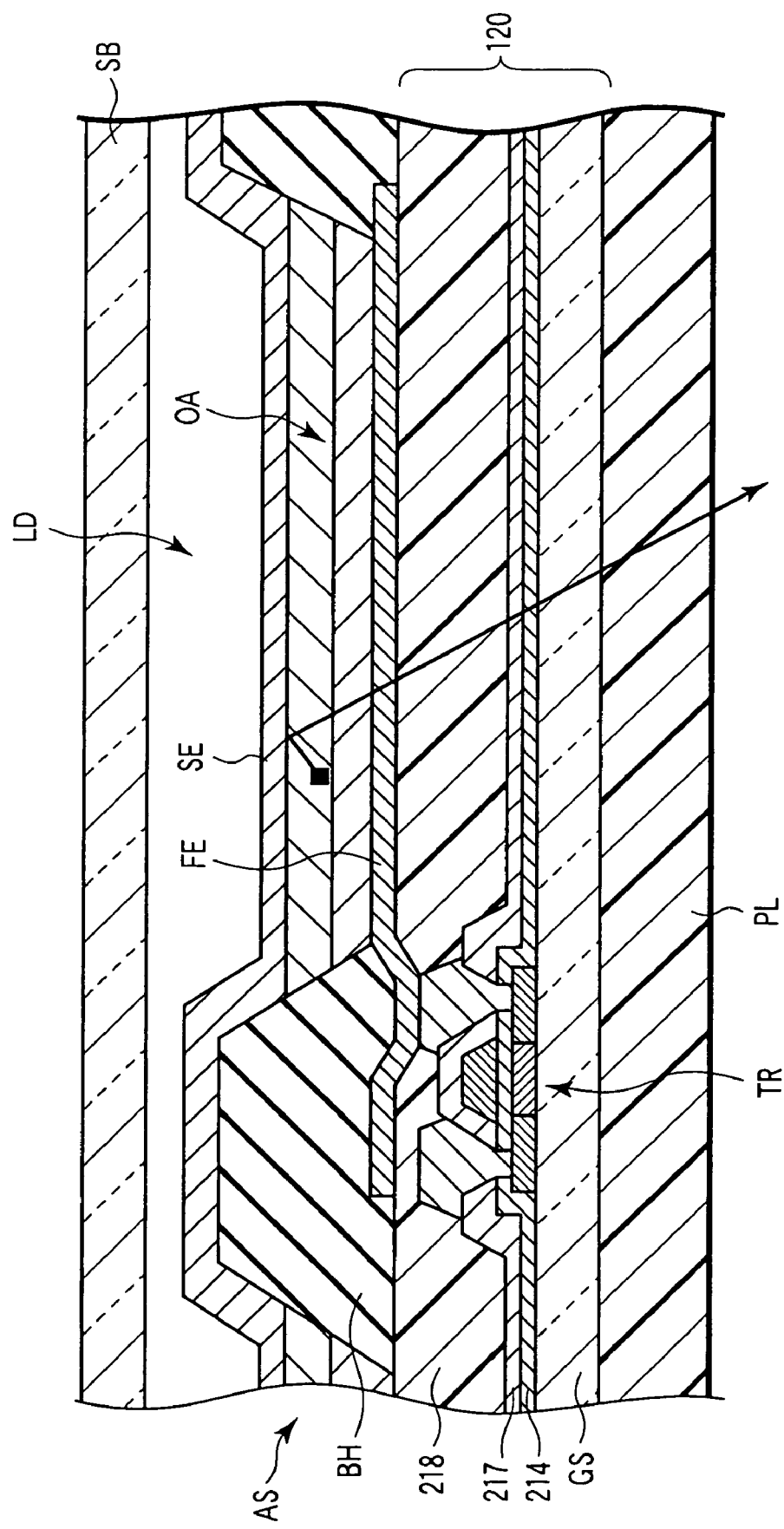
FIG. 17 is a cross-sectional view schematically showing a first example of the structure of an organic EL display apparatus according to a sixth embodiment of the invention.
Figure 18:
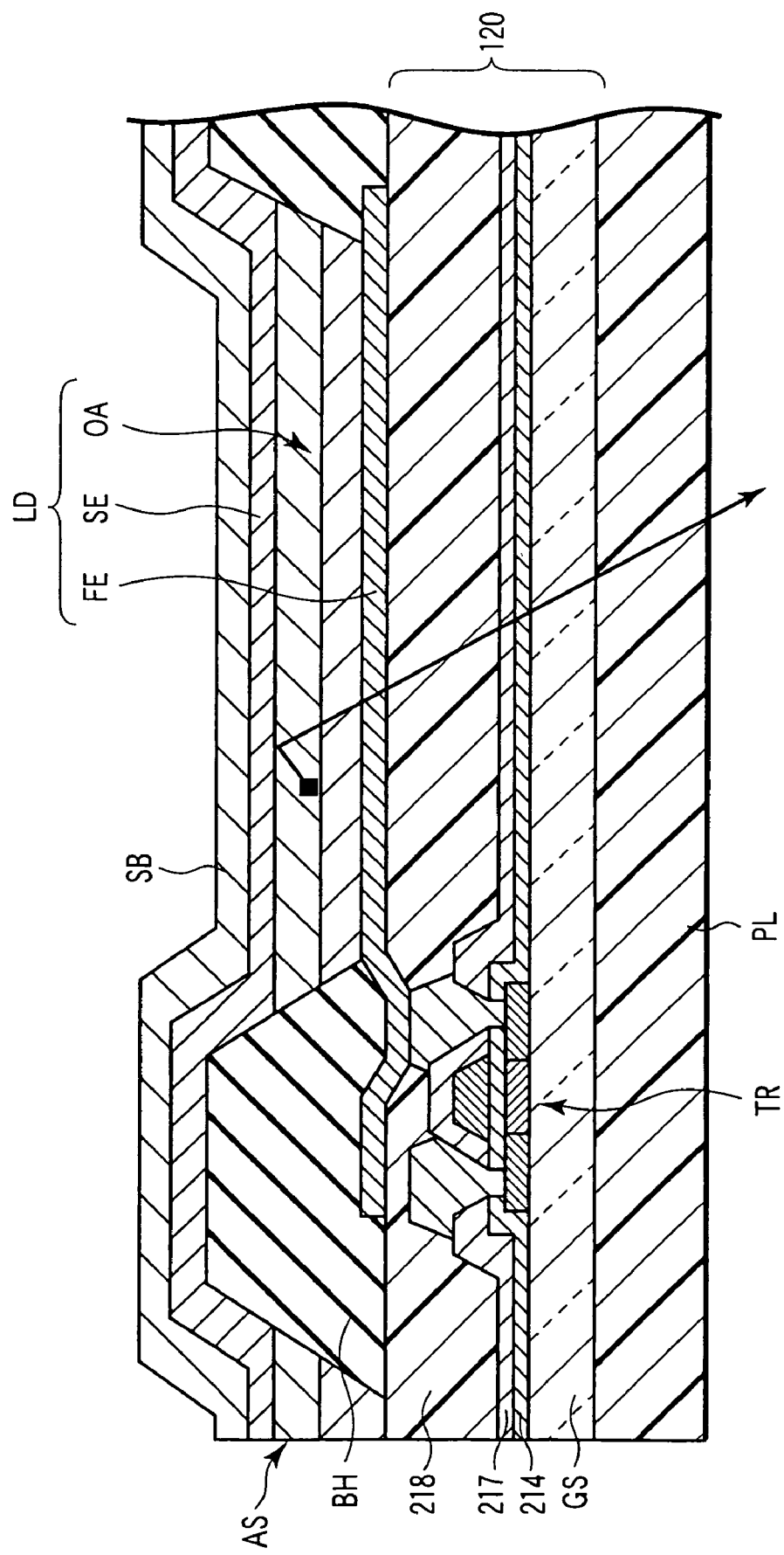
FIG. 18 is a cross-sectional view schematically showing a second example of the structure of the organic EL display apparatus according to the sixth embodiment of the invention.
Figure 19:
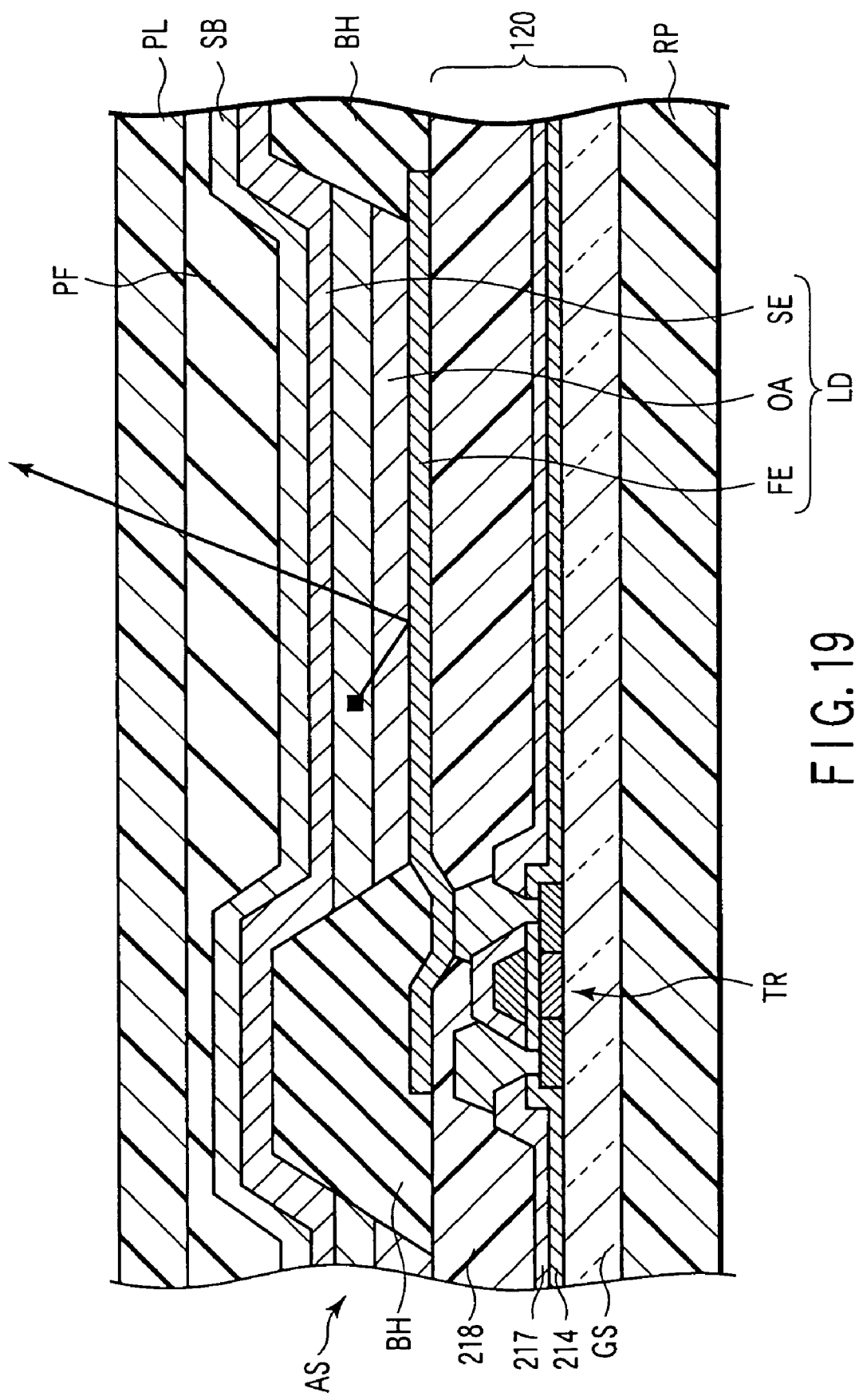
FIG. 19 is a cross-sectional view schematically showing a third example of the structure of the organic EL display apparatus according to the sixth embodiment of the invention.

As is shown in FIG. 17 to FIG. 19, the array substrate AS includes the organic EL device LD that is disposed on a wiring substrate 120. The wiring substrate 120 is configured such that the pixel switch, drive transistor TR, storage capacitor, scan line drive circuit, signal line drive circuit, various wiring (e.g. scan line, signal line and power supply line), gate insulation film 214, interlayer insulation film 217 and resin layer 218 are provided on an insulation support substrate GS that is formed of glass.

The first electrode FE included in the organic EL device LD is disposed on the insulation film provided on the surface of the wiring substrate 120. The first electrode FE is formed of a light-transmissive electrically-conductive material such as ITO or IZO and functions as an anode.

The organic active layer OA includes an organic compound having at least a light emission function. The organic active layer OA may have a three-layer stacked structure comprising a hole buffer layer commonly formed for the respective colors, an electron buffer layer, and an organic light-emission layer individually formed for each of the colors. Alternatively, the organic active layer OA may have a two-layer structure or a single layer structure with integrated functions. For example, the hole buffer layer is interposed between the anode and the organic light-emitting layer and is formed of a thin film of an aromatic amine derivative, a polythiophene derivative, polyaniline derivative, etc. The organic light-emitting layer is formed of an organic compound that has a light-emitting function of emitting red, green or blue light. When the organic light-emitting layer is formed by using, for instance, a high-polymer light-emitting material, it is formed of a thin film of PPV (poly-para-phenylenevinylene), a polyfluorene derivative or a precursor thereof, etc.

The second electrode SE is commonly provided on the organic active layer OA for the respective organic EL devices LD. The second electrode SE is formed of a metal film with an electron injection function, which is formed of, e.g. Ca (calcium), Al (aluminum), Ba (barium), Ag (silver), etc. The second electrode SE functions as a cathode.

The array substrate AS includes, on the effective display region 102, partition walls BH that isolate each display pixel section RX (R, G, B). The partition walls BH are arranged in a lattice fashion along peripheral edges of the first electrode FE.

In the organic EL device LD with the above-described structure, electrons and holes are injected in the organic active layer OA that is interposed between the first electrode FE and second electrode SE. The electron and hole are recombined to form an exciton, and light is produced by photo-emission of a predetermined wavelength which occurs when the exciton is deactivated. The EL light is emitted from the lower surface side of the array substrate AS, that is, from the first electrode FE side. Thereby, a display image is formed.

The OELD includes the sealing body SB that is disposed so as to cover at least the effective display region 102 of the major surface of the wiring substrate 120. In the first example of the structure shown in FIG. 17, the sealing body SB is a glass substrate. This glass substrate is attached to the array substrate AS by a seal material that is applied so as to surround at least the effective display region 102. An inert gas such as nitrogen gas is filled in the closed space between the organic EL device LD provided in the array substrate AS and the sealing body SB.

In a second example of the structure shown in FIG. 18, the sealing body SB has a multi-layer film structure wherein at least two thin films and a plurality of shield layers that shield these thin films from outside air are stacked. Each thin film is formed of a resin material with moisture-proof properties, such as an acrylic resin. Each shield layer is formed of a metal material such as aluminum or titanium, or a ceramic material such as alumina.

In the OELD with the above-described structure, the glass substrate GS of the array substrate AS has a thickness of 0.15 mm or less, preferably 0.1 mm or less (with a thickness of 0.1 mm in the sixth embodiment). In the first example of the structure shown in FIG. 17, the glass substrate of the sealing body SB also has a thickness of 0.15 mm or less, preferably 0.1 mm or less (with a thickness of 0.1 mm in the sixth embodiment). On the other hand, in the second example of the structure shown in FIG. 18, the multi-layer film of the sealing body SB has such a thickness as to have flexibility, while maintaining sufficient sealing properties.

In the OELD, a polarizer plate PL is provided on the outer surface of the glass substrate GS. The polarizer plate PL prevents the glass substrate GS from reflecting an undesired image for the observer side, such as an image of an external light source. Thus, overlapping between a display image formed on the glass substrate GS and an undesired image can be prevented, and degradation in display quality can be suppressed. The polarizer plate PL, like each of the preceding embodiments, is formed of a flexible resin.

The polarizer plate PL is fully extended to the end part of the glass substrate GS. Specifically, the polarizer plate PL has an outside dimension that is equal to or greater than the dimension of the glass substrate GS. The polarizer plate PL is thicker than the glass substrate GS, and it has a thickness of, e.g. 0.3 mm. In the case of the first example of the structure shown in FIG. 17, it is preferable that a reinforcement plate be provided on the outer surface of the sealing body SB. The reinforcement plate, like the above-described embodiments, is formed of a flexible resin, and it is thicker than the sealing body SB and has a thickness of, e.g. 0.3 mm.

In order to reduce the thickness of the OELD, the glass substrate GS is extremely thinned to, e.g. about 0.1 mm. Even in this case, the provision of the polarizer plate PL can reinforce the glass substrate GS. Depending on cases, a reinforcement plate may be provided to reinforce the sealing body SB. Thereby, even if a bending stress is applied to the OELD, crack of the glass substrate GS can be prevented, and an organic EL display apparatus with flexibility, which is not easily broken, can be provided. In particular, since the polarizer plate PL is fully extended to the end of the glass substrate GS, the occurrence of crack and chip in the glass substrate GS can remarkably be reduced.

Therefore, it is possible to provide a display apparatus with high reliability and applicability to various uses, which, for example, can be used in a bent state.

In the above-described sixth embodiment, the first and second examples of the structure are directed to so-called back-surface emission type OELDs, which emit EL light from the lower surface side of the array substrate AS. Alternatively, the sixth embodiment is applicable to a so-called front-surface emission type OELD, as in a third example of the structure shown in FIG. 19. In this case, the first electrode FE is formed of a light-reflective material and the second electrode SE is formed of a light-transmissive material, whereby EL light is emitted from the front surface side of the array substrate AS. In the case of the front-surface emission type OELD, compared to the back-surface emission type OELD, the aperture ratio is increased and the luminance is enhanced. In this case, for example, a protection film PF, which also serves for flattening, is provided on the sealing body SB, and a polarizer plate PL is further provided thereon. On the back side of the array substrate AS, a reinforcement plate RP is disposed in place of the polarizer plate. This reinforcement plate RP is configured similarly with the preceding embodiments.

As has been described above, each of the first to sixth embodiments of the invention provides a display apparatus having a plurality of display pixel sections, wherein an optical material is sealed between a pair of glass substrates. Each of the glass substrates has a film that is attached to the outer surface of the glass substrate and is thicker than the glass substrate. At least one of the films is formed of a polarizer plate. Each glass substrate is formed to have such a thickness as to permit bending of the display apparatus.

The display apparatus having a light-transmissive liquid crystal panel, as in the first embodiment (FIG. 2), third embodiment (FIG. 9) and fifth embodiment (FIG. 15), includes flexible polarizer plates disposed on the paired glass substrates. The display apparatus having a light-reflective liquid crystal panel, as in the second embodiment (FIG. 3) and fourth embodiment (FIG. 10), includes one film, which is the polarizer plate, and the other film, which is the flexible reinforcement plate. The display apparatus composed of the OELD, as in the first example (FIG. 17) and second example (FIG. 18) of the structure of the sixth embodiment, includes films, one of which is the polarizer plate. Thereby, flexible display apparatuses with small thickness and high durability can be provided.

The thickness of each of the glass substrates is set at 0.15 mm or less, and preferably 0.1 mm or less. Thereby, the fabricated display apparatus can be made flexible. With the provision of glass substrates each having such a thickness, the display apparatus can be bent with a radius of curvature of 200 mm or less.

In each of the display apparatuses of the first to fifth embodiments, a liquid crystal composition is employed as an optical material, and a liquid crystal layer formed of the liquid crystal composition is held between the paired substrates. The display apparatus of the sixth embodiment includes an EL material as an optical material, which forms the organic active layer.

Each of the first to sixth embodiments of the invention provides a display apparatus having a plurality of display pixel sections disposed on one of major surfaces (i.e. front surface) of a glass substrate. The glass substrate has a polarizer plate that is extended to the end of the glass substrate on the other major surface (i.e. back surface) of the glass substrate and is thicker than the glass substrate. The glass substrate is configured to have such a thickness as to permit bending of the display apparatus.

It is imperative that the thickness of the polarizer plate be greater than the thickness of the glass substrate. However, it is desirable that the thickness of the polarizer plate be limited to such a value as to ensure reduction in thickness of the display apparatus. For example, this thickness is set at 0.5 mm or less.

The display apparatus according to each of the above-described embodiments, which has a plurality of display pixel sections that are formed by sealing an optical material between a pair of glass substrates, is manufactured by the following steps: (a) a step of attaching the pair of glass substrates together with a predetermined distance; (b) polishing an outer surface of each of the glass substrates to a thickness of 0.15 mm or less; (c) attaching a film to the outer surface of at least one of the glass substrates, the film having a thickness greater than a thickness of the glass substrate; and (d) cutting the film and the pair of glass substrates into a predetermined size.

Specifically, as described in connection with the first embodiment, the step (a) of attaching the glass substrates together is as illustrated in FIGS. 4, 5 and 6A. The polishing step (b) is as illustrated in FIG. 6B and FIG. 7A. The film attaching step (c) is as illustrated in FIG. 6C and FIG. 7B. The cutting step (d) is as illustrated in FIG. 7B and FIG. 7C.

Prior to the step of attaching the glass substrates together, a step of dropping a liquid crystal composition on one of the glass substrates may be added. Specifically, the step of dropping is as illustrated in FIG. 4 and FIG. 5. This makes the manufacturing time shorter than in the case of vacuum-injecting the liquid crystal composition.

Besides, following the cutting step, a step of connecting the glass substrate, on which no film is disposed, to an external electrode terminal may be added. Furthermore, following the step of connection to the external electrode terminal, a step of attaching another film on the glass substrate may be added.

The present invention is not limited to the above-described embodiments. At the stage of practicing the invention, various modifications and alterations may be made without departing from the spirit of the invention. The embodiments may properly be combined and practiced, if possible. In this case, advantages are obtained by the combinations.

As has been described above, the present invention can provide a display apparatus and a manufacturing method thereof, which can achieve further reduction in thickness while maintaining display performance. In addition, the invention can provide a display apparatus and a manufacturing method thereof, which can achieve further reduction in thickness while having high durability.

What is claimed is:

1. A display apparatus comprising:
   a plurality of display pixel sections on a major surface of a substrate, wherein
   the substrate has a glass substrate and a polarizer plate that is disposed to extend to an end part of the glass substrate on another major surface of the substrate, and has a thickness greater than a thickness of the glass substrate, and
   the glass substrate has a thickness that permits bending of the display apparatus, wherein the display apparatus is configured to be bendable with a radius of curvature of 200 mm or less.

2. The display apparatus according to claim 1, wherein the thickness of the glass substrate is 0.15 mm or less.

3. The display apparatus according to claim 2, wherein the thickness of the polarizer plate is 0.5 mm or less.

4. The display apparatus according to claim 1, wherein the display pixel section includes a switch element near an intersection of a signal line and a scan line that are disposed to be substantially perpendicular to each other on the glass substrate, and the switch element is composed of a thin film transistor including a polysilicon film.

5. The display apparatus according to claim 4, wherein the display apparatus includes:

a signal line drive circuit on the glass substrate and configured to supply a drive signal to the signal line; and a scan line drive circuit on the glass substrate and configured to supply a drive signal to the scan line.

6. The display apparatus according to claim 5, wherein the signal line drive circuit and the scan line drive circuit are each composed of thin film transistors including a polysilicon film.

* * * * *